(12) United States Patent
Satsukawa

(10) Patent No.: US 7,847,582 B2
(45) Date of Patent: Dec. 7, 2010

(54) LOGIC CIRCUIT INCLUDING A PLURALITY OF MASTER-SLAVE FLIP-FLOP CIRCUITS

(75) Inventor: Yoshihiko Satsukawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/155,829

(22) Filed: Jun. 10, 2008

(65) Prior Publication Data

US 2008/0315912 A1      Dec. 25, 2008

(30) Foreign Application Priority Data

Jun. 25, 2007  (JP) .............................. 2007-166554

(51) Int. Cl.
*H03K 19/00*      (2006.01)
(52) U.S. Cl. ................. 326/16; 326/9; 326/93
(58) Field of Classification Search ........................ None
See application file for complete search history.

(56) References Cited

U.S. PATENT DOCUMENTS 6,490,702 B1 *  12/2002  Song et al. .................. 714/726

7,051,255 B2 *  5/2006  Gschwind ................... 714/726

FOREIGN PATENT DOCUMENTS

JP      7-198787      8/1995
JP      2000-214223   8/2000

* cited by examiner

*Primary Examiner*—Anh Q Tran
(74) *Attorney, Agent, or Firm*—Staas & Halsey LLP

(57) ABSTRACT

According to an aspect of an embodiment, a logic circuit includes a first master latch included in one of the master-slave flip-flop circuits, the first master latch having a first scan data input for receiving scan data, the first master latch latching the scan data and outputting latched scan data, a second master latch included in another of the master-slave flip-flop circuits, the second master latch having a second scan data input operatively connected to receive an output of the first master latch, the second master latch latching the scan data inputted into the second scan data input and outputting latched scan data and a slave latch included in one of the master-slave flip-flop circuits, the slave latch having a scan data input operatively connected to receive an output of the second master latch.

8 Claims, 24 Drawing Sheets

LOGIC CIRCUIT INCLUDING A PLURALITY OF MASTER-SLAVE FLIP-FLOP CIRCUITS

BACKGROUND

The present technique relates to a logic circuit including a plurality of master-slave flip-flop circuits.

A scan shift operation for an LSI test is performed using a master-slave flip-flop circuit including a master latch and a slave latch. As a sequential circuit in a logic circuit, a master-slave flip-flop circuit is generally used.

In the scan shift operation, a clock for controlling a master and a clock for controlling a slave are alternately turned on, and scan data supplied from the outside of LSI is input from a scan-in (SI) input terminal of the flip-flop circuit. The scan data output from a scan-out (SO) output terminal of the flip-flop circuit is input to an SI input terminal of another flip-flop circuit. This input operation is repeated to form a scan chain. An output of a final connected flip-flop circuit is output to the outside of the LSI. This output is measured to determine whether or not the LSI has a failure.

As the circuit scale of the LSI increases, the number of flip-flop circuits forming a scan chain also increases, resulting in an increase in power consumption of the scan chain.

Japanese Laid-open Patent Publication Nos. 07-198787 and 2000-214223 are examples-of related art.

SUMMARY

According to an aspect of an embodiment, a logic circuit includes a plurality of master-slave flip-flop circuits and a test circuit configured to form a scan chain when testing the logic circuit and the scan chain includes a first master latch included in one of the master-slave flip-flop circuits, the first master latch having a first scan data input for receiving scan data, the first master latch latching the scan data and outputting latched scan data, a second master latch included in another of the master-slave flip-flop circuits, the second master latch having a second scan data input operatively connected to receive an output of the first master latch, the second master latch latching the scan data inputted into the second scan data input and outputting latched scan data and a slave latch included in one of the master-slave flip-flop circuits, the slave latch having a scan data input operatively connected to receive an output of the second master latch, the slave latch latching the scan data inputted into the scan data input and outputting latched scan data as a test output data.

DESCRIPTION OF THE PREFERRED EMBODIMENTS

An embodiment will be described hereinafter with reference to the drawings.

Figure 1:
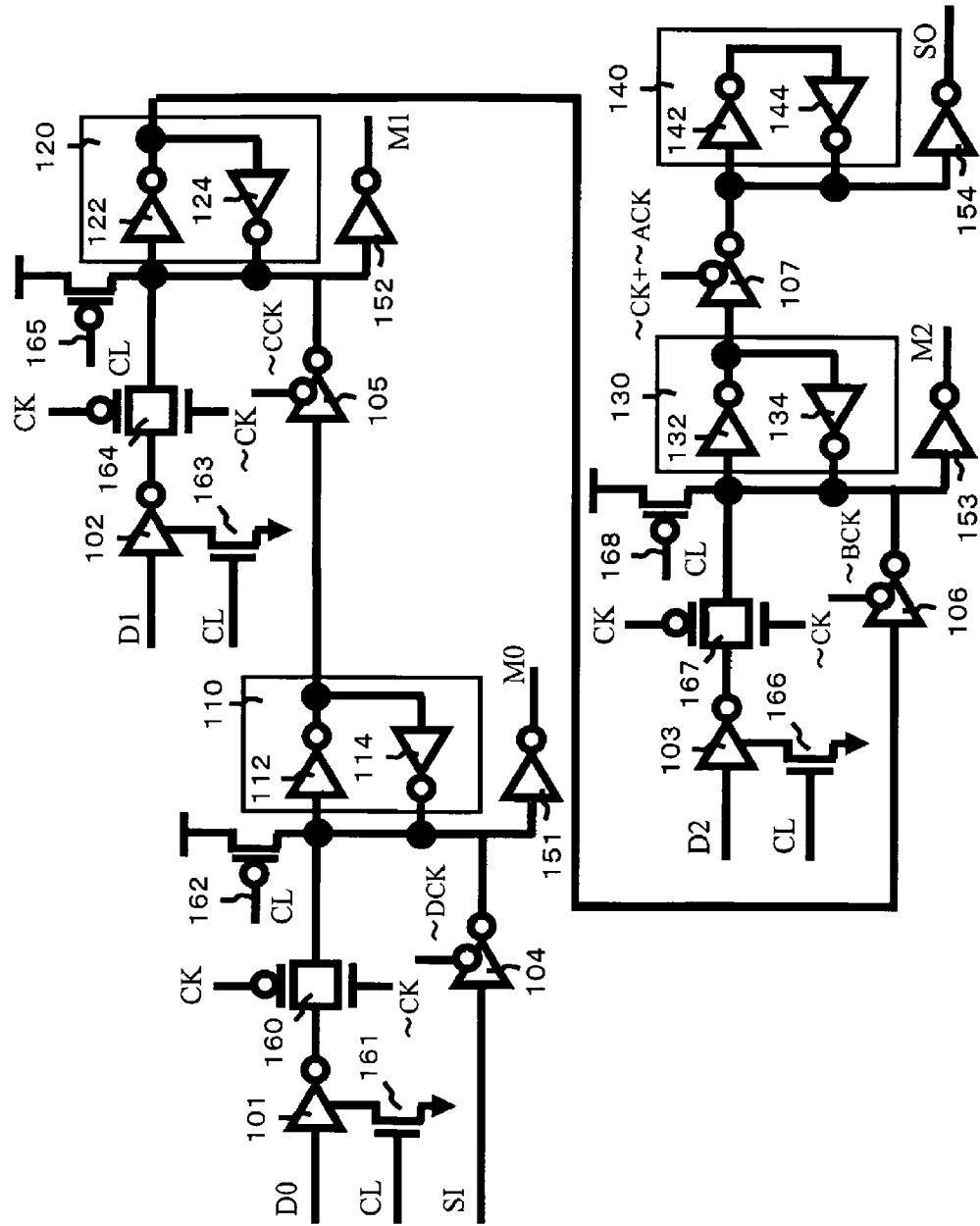
FIG. 1 is a circuit diagram of an LSI test circuit according to an embodiment.
Figure 2:
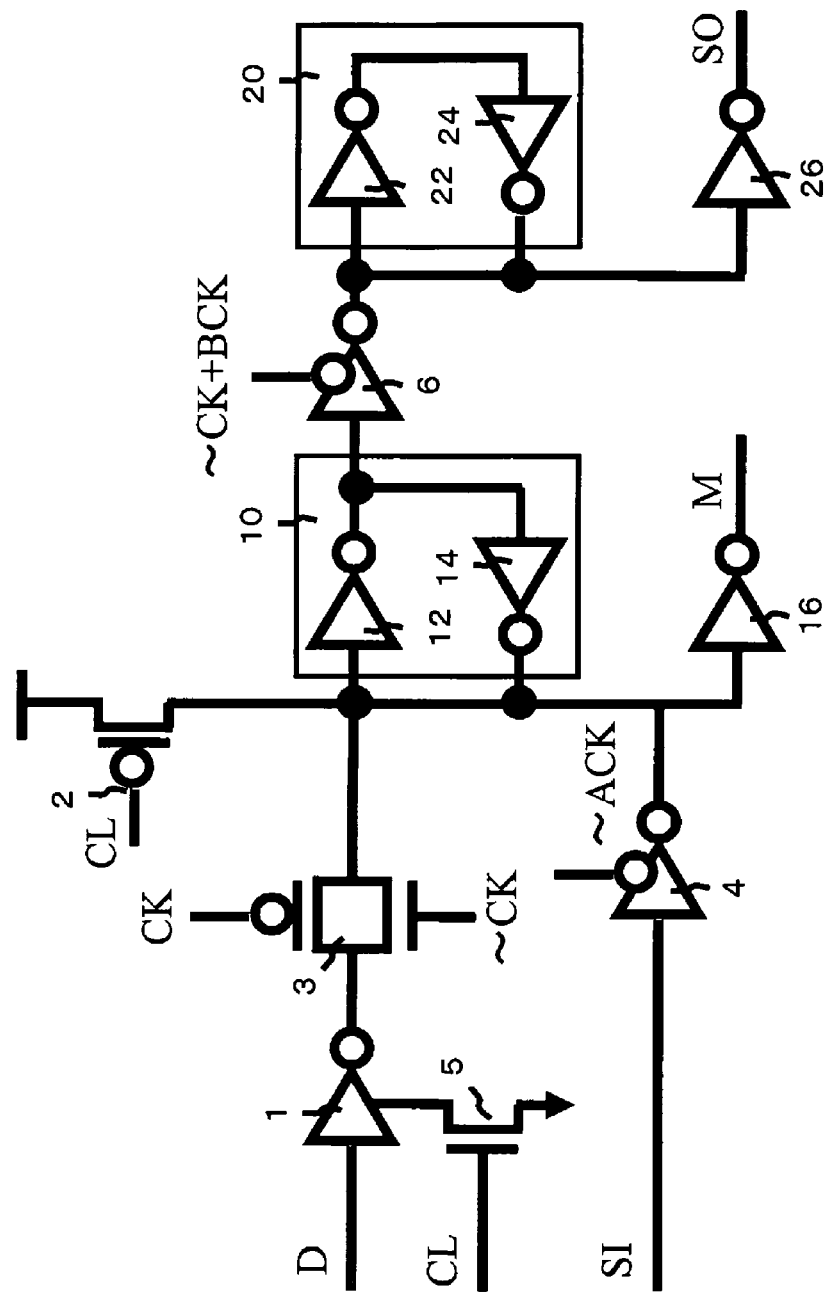
FIG. 2 is a circuit diagram of a transmission latch.

FIG. 1 shows an example of an LSI test circuit according to the embodiment. The LSI test circuit includes, for example, a first master latch 110, a second master latch 120, a third master latch 130, and a slave latch 140. In this embodiment, the LSI test circuit is formed with a reduced number of slave latches connected to a master latch of a transmission latch circuit in which data input from an input terminal is passed (transmitted) to an output terminal during a period of time during which a clock signal is in a high or low level and in which when the clock signal is changed to the low or high level, the current data is held and is output from the output terminal. A logic circuit includes a plurality of master-slave flip-flop circuits. And a test circuit configured to form a scan chain when testing the logic circuit. The first master latch 110 is included in one of the master-slave flip-flop circuits, the second master latch 120 is included in one of the master-slave flip-flop circuit, the third master latch 130 is included in one of the master-slave flip-flop circuit and slave latch 140 is included in one of the master-slave flip-flop circuit. The chain of a plurality of master latches are operatively connected in cascade respectively so as to successively transfer scan data and the slave latch is operatively connected to receive the scan data from the last stage of the chain of the cascade of the master latches so as to output the scan data to the exterior. FIG. 2 shows a transmission latch circuit. The transmission latch circuit includes a master latch 10 and a slave latch 20. The master latch 10 includes inverters 12 and 14. An output of the inverter 12 is input to an inverter 6 having an enable terminal. When a clock signal is input from outside, the inverter 6 having the enable terminal inputs the output of the inverter 12 to an inverter 22. The slave latch 20 includes the inverter 22 and an inverter 24. An output of the inverter 22 is connected to an input of the inverter 24. An output of the inverter 24 is connected to an input of the inverter 22 and an input of an inverter 26. The inverter 26 outputs an input from the inverter 24.

The master latch 10 is connected to a transfer gate 3, a clear switch 2, an inverter 4 having an enable terminal, and an inverter 16. The transfer gate 3 is connected to an inverter 1. The inverter 1 is connected to an n-type transistor 5.

Data (D) (system data) is input to the inverter 1. The inverter 1 outputs the input data to the transfer gate 3. The transfer gate 3 is formed of two pass transistors having opposite polarities. When a clock signal is input from outside, the transfer gate 3 outputs the data output from the inverter 1 to the master latch 10. The n-type transistor 5 disconnects a path from ground to the output of the inverter 1. The clear switch 2 is short-circuited to a power supply potential to clear the data held in the master latch 10 or the like. Scan-in data (SI data) is input to the inverter 4 having the enable terminal. When a clock signal is input from outside, the inverter 4 having the enable terminal inputs the input SI data to the inverter 12. An output of the inverter 14 is input to the inverter 16, and the data held in the master latch 10 is output to the outside of the flip-flop circuit. Therefore, a signal can be obtained without waiting for an up edge of clock.

Referring back to FIG. 1, the master latch 110 includes inverters 112 and 114. An output of the inverter 112 is connected to an input of the inverter 114. An output of the inverter 114 is connected to an input of the inverter 112. Thus, a latch circuit is formed.

Scan-in data SI is input to an inverter 104 having an enable terminal. The inverter 104 having the enable terminal functions as a first scan data input. A clock signal (DCK), which is a first control signal, is input to the enable terminal of the inverter 104. The inverter 104 inverts the input data SI and outputs the inverted data SI. An output of the inverter 104 is connected to an input of the inverter 112. The master latch 110 uses the clock signal (DCK) as an input timing signal, and latches the output of the inverter 104 when the clock signal (DCK) becomes a high level. An output of the inverter 112 is input to an inverter 105 having an enable terminal.

The master latch 110 is connected to a transfer gate 160, a clear switch 162, and an inverter 151. The transfer gate 160 is connected to an inverter 101. The inverter 101 is connected to an n-type transistor 161.

Data (DO), which is data to be held, is input to the inverter 101. The inverter 101 functions as a first system data input. The inverter 101 inverts the input data, and outputs the inverted data to the transfer gate 160. When a clock signal is input from outside, the transfer gate 160 outputs the data output from the inverter 101 to the master latch 110. The n-type transistor 161 disconnects a path from ground to the output of the inverter 101. The clear switch 162 is short-circuited to a power supply potential to clear the data held in the master latch 110 or the like. The output of the inverter 114 is input to the inverter 151, and the data held in the master latch 110 is output to the outside of the flip-flop circuit. Therefore, a signal can be obtained without waiting for an up edge of clock.

The master latch 120 includes inverters 122 and 124. An output of the inverter 122 is connected to an input of the inverter 124. An output of the inverter 124 is connected to an input of the inverter 122. Thus, a latch circuit is formed.

The output of the inverter 112 is input to the inverter 105 having the enable terminal. The inverter 105 having the enable terminal functions as a second scan data input. A clock signal (CCK), which is a second control signal, is input to the enable terminal of the inverter 105. The inverter 105 inverts the output of the inverter 112, and outputs the result. An output of the inverter 105 is connected to the input of the inverter 122. The master latch 120 uses the clock signal (CCK) as an input timing signal, and latches the output of the inverter 105 when the clock signal (CCK) becomes a high level. The output of the inverter 122 is input to an inverter 106 having an enable terminal.

The master latch 120 is connected to a transfer gate 164, a clear switch 165, and an inverter 152. The transfer gate 164 is connected to an inverter 102. The inverter 102 is connected to an n-type transistor 163.

Data (D1), which is data to be held, is input to the inverter 102. The inverter 102 functions as a second system data input. The inverter 102 outputs the input data to the transfer gate 164. When a clock signal is input from outside, the transfer gate 164 outputs the data output from the inverter 102 to the master latch 120. The n-type transistor 163 disconnects a path from ground to the output of the inverter 102. The clear switch 165 is short-circuited circuited to the power supply potential to clear the data held in the master latch 120 or the like. The output of the inverter 124 is input to the inverter 152, and the data held in the master latch 120 is output to the outside of the flip-flop circuit. Therefore, a signal can be obtained without waiting for an up edge of clock.

The master latch 130 includes inverters 132 and 134. An output of the inverter 132 is connected to an input of the inverter 134. An output of the inverter 134 is connected to an input of the inverter 132. Thus, a latch circuit is formed.

The output of the inverter 122 is input to the inverter 106 having the enable terminal. The inverter 106 having the enable terminal functions as a third scan data input. A clock signal (BCK), which is a third control signal, is input to the enable terminal of the inverter 106. The inverter 106 inverts the output of the inverter 122 and output the result. An output of the inverter 106 is connected to the input of the inverter 132. The master latch 130 uses the clock signal (BCK) as an input timing signal, and latches the output of the inverter 106 when the clock signal (BCK) becomes a high level. The output of the inverter 132 is input to an inverter 107 having an enable terminal.

The master latch 130 is connected to a transfer gate 167, a clear switch 168, and an inverter 153. The transfer gate 167 is connected to an inverter 103. The inverter 103 is connected to an n-channel transistor 166.

Data (D2), which is data to be held, is input to the inverter 103. The inverter 103 functions as a third system data input. The inverter 103 outputs the input data to the transfer gate 167. When a clock signal is input from outside, the transfer gate 167 outputs the data output from the inverter 103 to the master latch 130. The n-type transistor 166 disconnects a path from ground to the output of the inverter 103. The clear switch 168 is short-circuited to the power supply potential to clear the data held in the master latch 130. The output of the inverter 134 is input to the inverter 153, and the data held in the master latch 130 is output to the outside of the flip-flop circuit. Therefore, a signal can be obtained without waiting for an up edge of clock.

The slave latch 140 includes inverters 142 and 144. An output of the inverter 142 is connected to an input of the inverter 144. An output of the inverter 144 is connected to an input of the inverter 142. Thus, a latch circuit is formed.

The output of the inverter 132 is input to the inverter 107 having the enable terminal. A clock signal (ACK), which is a fourth control signal, is input to the enable terminal of the inverter 107. The inverter 107 inverts the output of the inverter 132 and outputs the result. An output of the inverter 107 is connected to the input of the inverter 142. The slave latch 140 uses the clock signal (ACK) as an input timing signal, and latches the output of the inverter 107 when the clock signal (ACK) becomes a high level. An inverter 154 inverts the output of the inverter 144 and outputs the result. Output data SO (test out put data) is output from the inverter 154.

In the LSI test circuit of the embodiment, therefore, no slave latch is connected to transmission master latches each having an output from which data held in the master latch is output to the outside of the flip-flop circuit, and the transmission master latches are connected to form a scan chain. This ensures that as far as the master latches normally operate, the data held in the master latches can be successfully output from the outputs of the master latches. The slave latch is connected to a master latch for which a high-speed signal output is not demanded, and a scan chain is formed.

Figure 3:
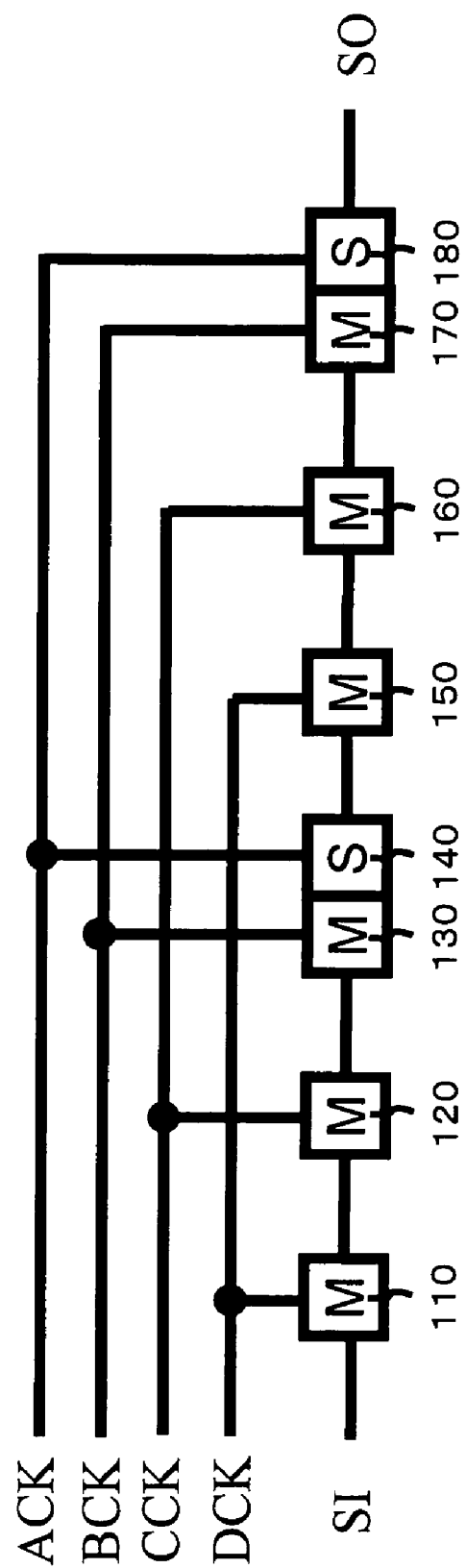
FIG. 3 is a diagram showing a structure of a scan chain according to the embodiment.
Figure 4:
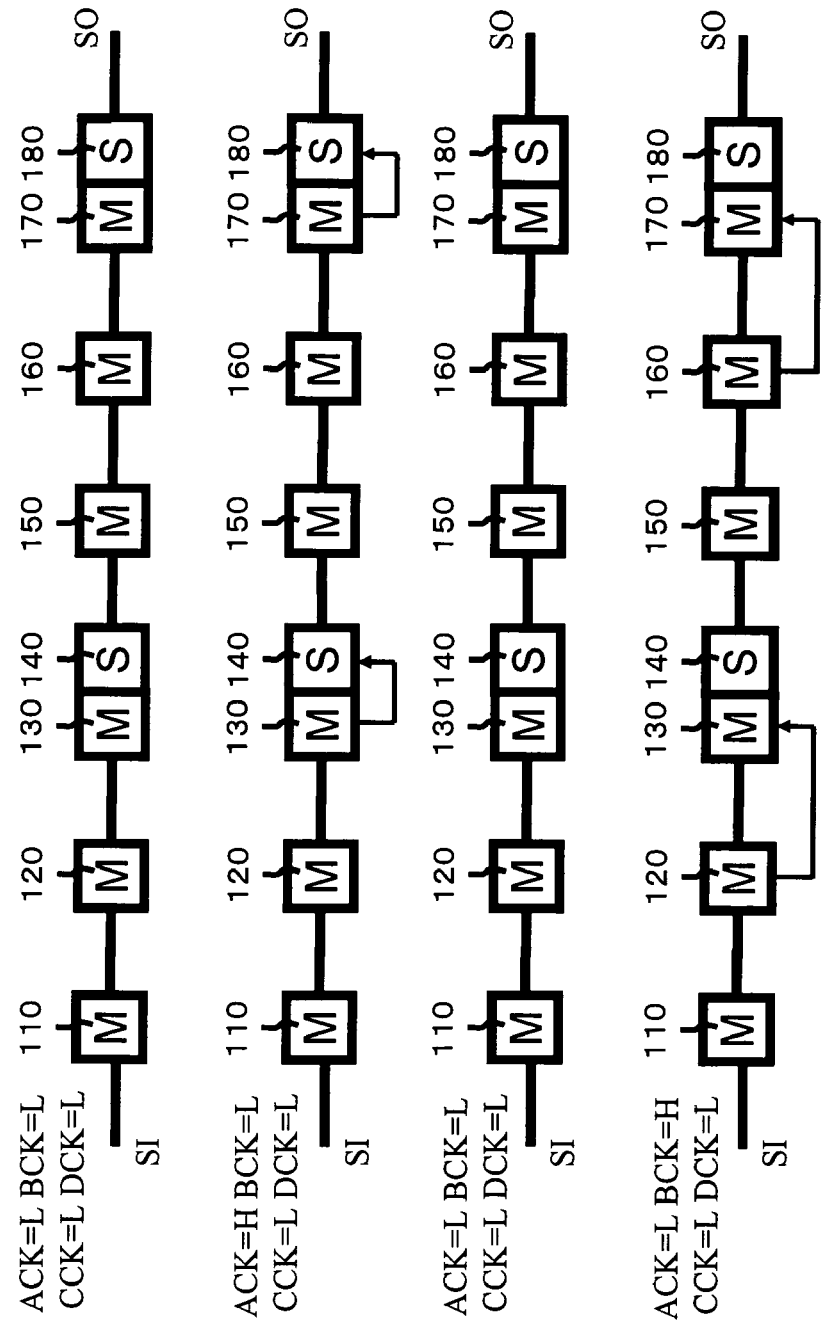
FIG. 4 is a diagram showing a first part of the operation of the scan chain according to the embodiment.

FIG. 3 shows an example structure of a scan chain of the LSI according to the embodiment. FIG. 4 shows an example of the operation of the scan chain. As shown in FIG. 3, in this example, the scan chain includes, for example, master latches 110, 120, 130, 150, 160, and 170, and slave latches 140 and 180. A clock signal ACK for controlling the slave latches 140 and 180, a clock signal BCK for controlling the master latches 130 and 170, a clock signal CCK for controlling the master latches 120 and 160, and a clock signal DCK for controlling the master latches 110 and 150 are alternately turned on, and input data SI input to the master latch 110 is output as output data SO from the slave latch 180.

As shown in FIG. 4, when all the clock signals ACK, BCK, CCK, and DCK are in a low level, the master latches 110, 120, 130, 150, 160, and 170 and the slave latches 140 and 180 hold data. When only the clock signal ACK is in a high level, the slave latch 140 latches the output of the master latch 130, and the slave latch 180 latches the output of the master latch 170. When only the clock signal BCK is in a high level, the master latch 130 latches the output of the master latch 120, and the master latch 170 latches the output of the master latch 160.

Figure 5:
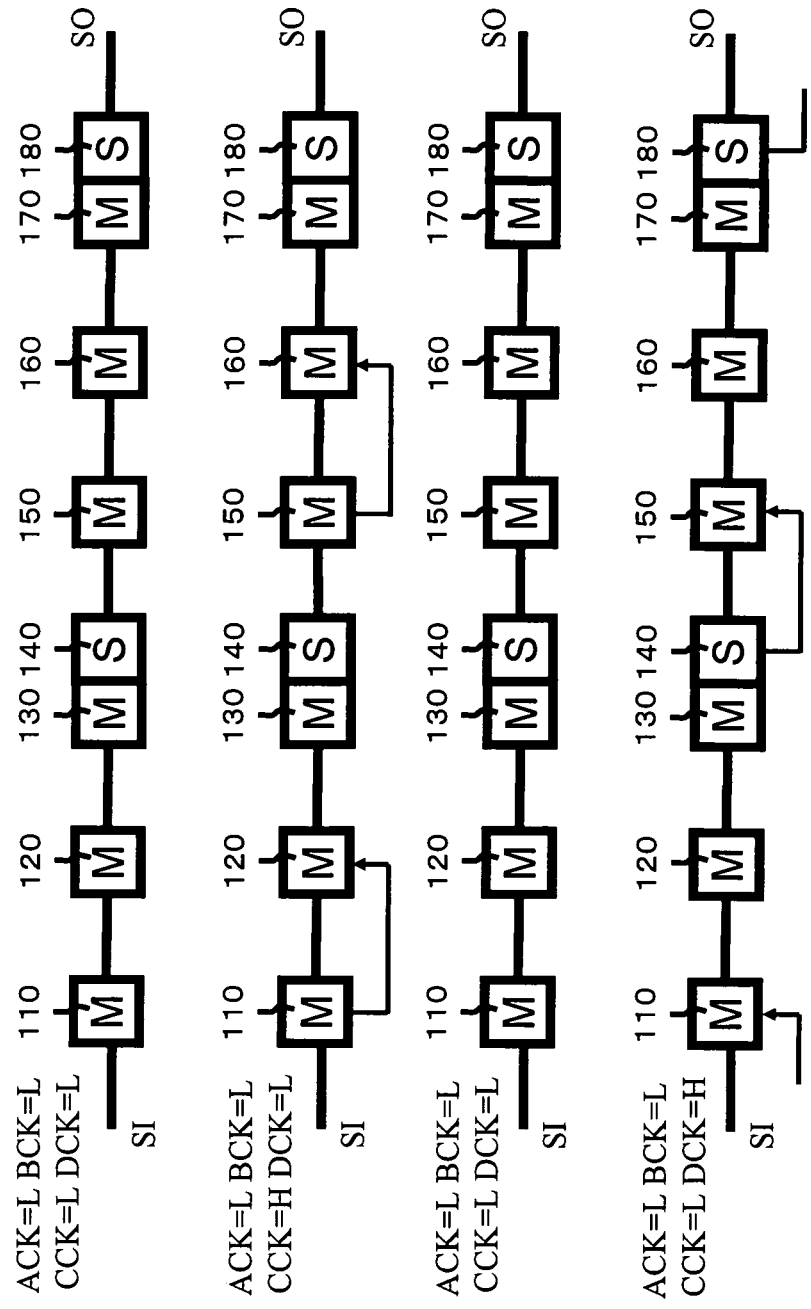
FIG. 5 is a diagram showing a second part of the operation of the scan chain according to the embodiment.

As shown in FIG. 5, when all the clock signals ACK, BCK, CCK, and DCK are in a low level, the master latches 110, 120, 130, 150, 160, and 170 and the slave latches 140 and 180 hold data. When only the clock signal CCK is in a high level, the master latch 120 latches the output of the master latch 110, and the master latch 160 latches the output of the master latch 150. When only the clock signal DCK is in a high level, the master latch 110 latches the input data SI, the master latch 150 latches the output of the slave latch 140, and the slave latch 180 outputs the held data as output data SO.

Accordingly, it is not necessary to connect a slave latch, which is not used for system operation, to the circuit for a scan shift. Thus, the number of slave latches can significantly be reduced. This allows a reduction in the circuit size and a reduction in the power consumption of the LSI. Further, due to the reduction in the circuit size, the wire length can be reduced and a reduction in operating power or a reduction in delay time can be realized. Furthermore, the power consumption of the scan chain is reduced, whereby the amount of current flowing in latch circuits forming the scan chain can be reduced to prevent a failure of the LSI, which is caused by electromigration. Moreover, the reduction in the power consumption of the LSI facilitates cooling of the LSI.

Figure 6:
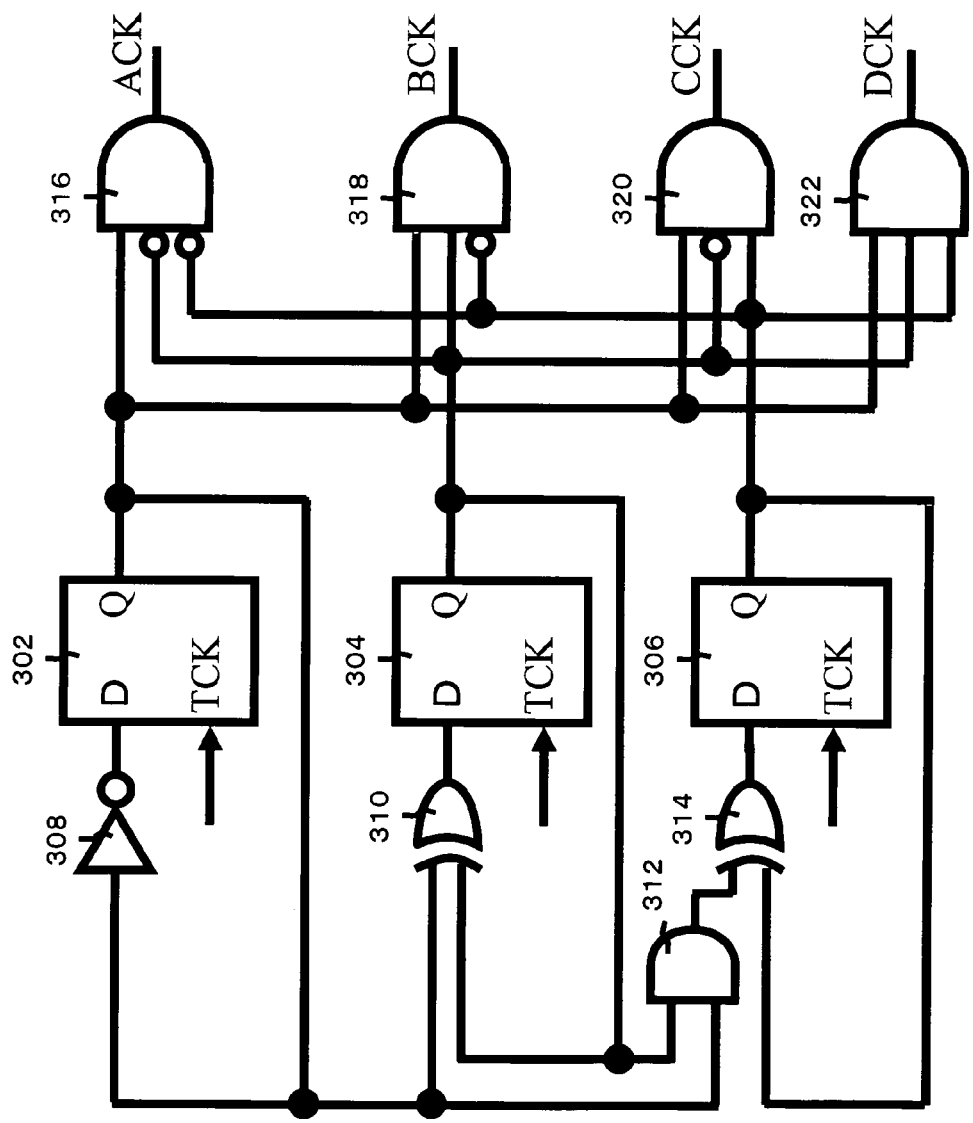
FIG. 6 is a diagram showing a first example of a state machine for generating a clock signal.

FIG. 6 shows an example of a clock generation circuit using a state machine. A flip-flop circuit 302 uses an external test clock TCK as an input timing signal, and latches an output of an inverter 308. A flip-flop circuit 304 uses the external test clock TCK as an input timing signal, and latches an output of an exclusive-OR (XOR) circuit 310. A flip-flop circuit 306 uses the external test clock TCK as an input timing signal, and latches an output of an XOR circuit 314.

The inverter 308 inverts an output of the flip-flop circuit 302. An output of the inverter 308 is connected to an input of the flip-flop circuit 302. The XOR circuit 310 performs an XOR operation between the output of the flip-flop circuit 302 and the output of the flip-flop circuit 304, and outputs the operation result. An output of the XOR circuit 310 is connected to an input of the flip-flop circuit 304. An AND circuit 312 performs an AND operation between the output of the flip-flop circuit 302 and the output of the flip-flop circuit 304, and outputs the operation result. An output of the AND circuit 312 is connected to an input of the XOR circuit 314. The XOR circuit 314 performs an XOR operation between the output of the flip-flop circuit 306 and the output of the AND circuit 312, and outputs the operation result. An output of the XOR circuit 314 is connected to an input of the flip-flop circuit 306. A frequency dividing circuit operable to divide the frequency of the external test clock TCK is thus formed.

An AND circuit 316 performs an AND operation between the output of the flip-flop circuit 302, the inversion of the output of the flip-flop circuit 304, and the inversion of the output of the flip-flop circuit 306, and outputs the operation result as a clock signal ACK. An AND circuit 318 performs an AND operation between the output of the flip-flop circuit 302, the output of the flip-flop circuit 304, and the inversion of the output of the flip-flop circuit 306, and outputs the operation result as a clock signal BCK. An AND circuit 320 performs an AND operation between the output of the flip-flop circuit 302, the inversion of the output of the flip-flop circuit 304, and the output of the flip-flop circuit 306, and outputs the operation result as a clock signal CCK. An AND circuit 322 performs an AND operation between the output of the flip-flop circuit 302, the output of the flip-flop circuit 304, and the output of the flip-flop circuit 306, and outputs the operation result as a clock signal DCK.

Figure 7:
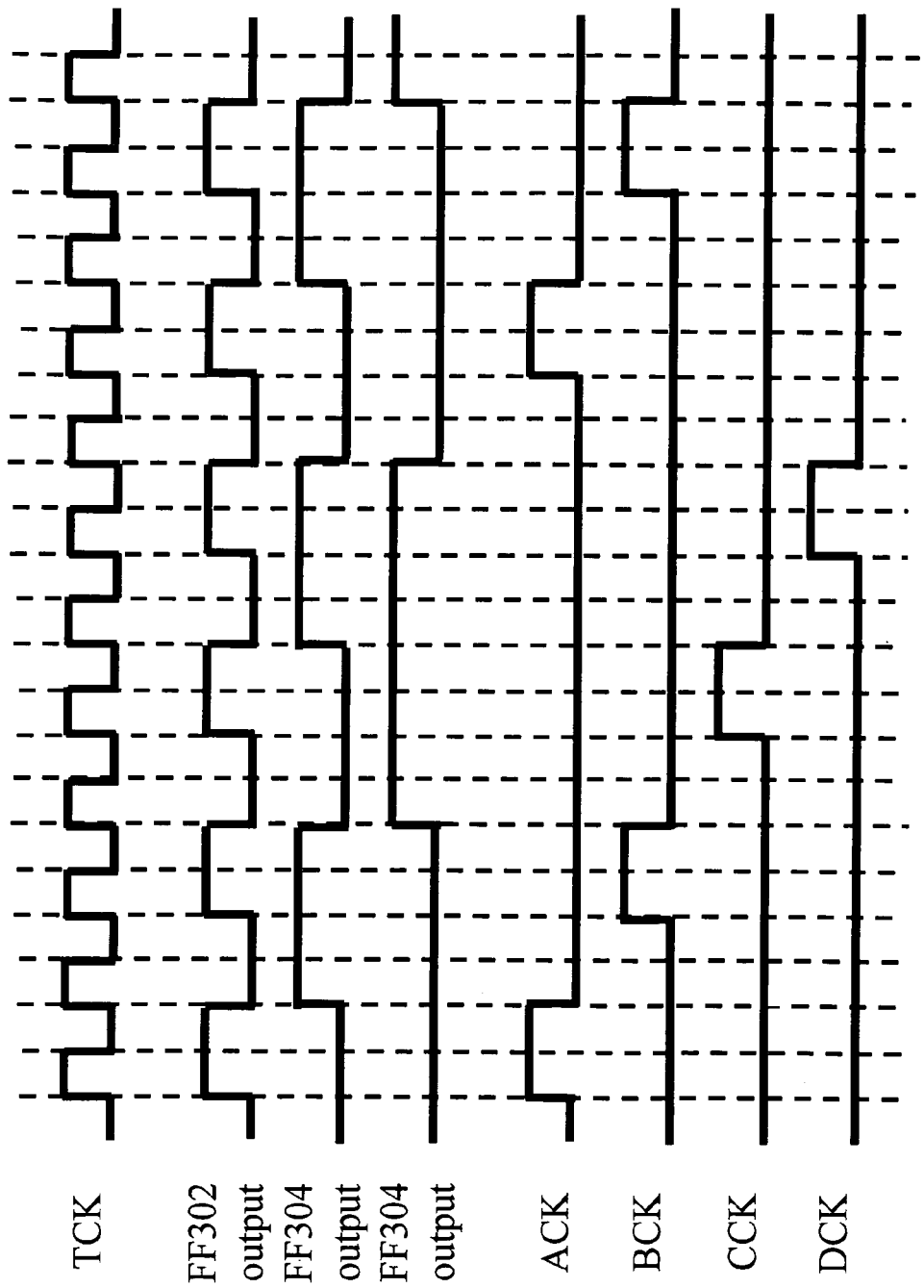
FIG. 7 is a waveform diagram showing the operation of the state machine.

FIG. 7 shows waveforms of clock signals generated using a state machine. The top waveform in FIG. 7 indicates the external test clock TCK.

The second waveform from the top in FIG. 7 is a waveform of an output signal of a Q terminal of the flip-flop circuit 302. At a rising edge of the first pulse of the external test clock TCK, the flip-flop circuit 302 latches data having the same signal level as that of a signal input to a D terminal of the flip-flop circuit 302. The flip-flop circuit 302 latches high-level data and outputs a high-level signal from the Q terminal. At a rising edge of the second pulse of the external test clock TCK, the flip-flop circuit 302 latches data having the same signal level as that of a signal input to the D terminal. The flip-flop circuit 302 latches low-level data and outputs a low-level signal from the Q terminal. The signal output from the Q terminal of the flip-flop circuit 302 is input to the AND circuits 316, 318, 320, and 322.

The third waveform from the top in FIG. 7 is a waveform of an output signal of a Q terminal of the flip-flop circuit 304. At a rising edge of the second pulse of the external test clock TCK, the flip-flop circuit 304 latches data having the same signal level as that of a signal input to a D terminal of the flip-flop circuit 304. The flip-flop circuit 304 latches a high-level signal and outputs a high-level signal from the Q terminal. At a rising edge of the fourth pulse of the external test clock TCK, the flip-flop circuit 304 latches data having the same signal level as that of a signal input to the D terminal. The flip-flop circuit 304 latches a low-level signal and outputs a low-level signal from the Q terminal. The signal output from the Q terminal of the flip-flop circuit 304 is input to the AND circuits 318 and 322. The signal output from the Q terminal is inverted and also input to the AND circuits 316 and 320.

The fourth waveform from the top in FIG. 7 indicates an output of a Q terminal of the flip-flop circuit 306. At a rising edge of the fourth pulse of the external test clock TCK, the flip-flop circuit 306 latches data having the same signal level as that of a signal input to a D terminal of the flip-flop circuit 306. The flip-flop circuit 306 latches high-level data and outputs a high-level signal from the Q terminal. At a rising edge of the eighth pulse of the external test clock TCK, the flip-flop circuit 306 latches data having the same signal level as that of a signal input to the D terminal. The flip-flop circuit 306 latches low-level data and outputs a low-level signal from the Q terminal. The signal output from the Q terminal of the flip-flop circuit 306 is input to the AND circuits 320 and 322. The signal output from the Q terminal is inverted and also input to the AND circuits 316 and 318.

The fifth waveform from the top in FIG. 7 is a waveform of the output signal (ACK) of the AND circuit 316. An AND operation between the output indicated by the second waveform from the top in FIG. 7, the inversion of the output indicated by the third waveform from the top in FIG. 7, and the inversion of the output indicated by the fourth waveform from the top in FIG. 7 results in the waveform of the output signal (ACK), which is the fifth waveform from the top in FIG. 7. The output signal ACK becomes a high level at a rising edge of the first pulse of the external test clock TCK, and becomes a low level at a rising edge of the second pulse of the external test clock TCK. The output signal ACK becomes the high level again at a rising edge of the ninth pulse of the external test clock TCK, and becomes the low level again at a rising edge of the tenth pulse of the external test clock TCK. The output signal ACK subsequently repeats transition between the high and low levels in the manner described above.

The sixth waveform from the top in FIG. 7 is a waveform of the output signal (BCK) of the AND circuit 318. An AND operation between the output indicated by the second waveform from the top in FIG. 7, the output indicated by the third waveform from the top in FIG. 7, and the inversion of the output indicated by the fourth waveform from the top in FIG. 7 results in the output indicated by the sixth waveform from the top in FIG. 7. The output signal BCK becomes a high level at a rising edge of the third pulse of the external test clock TCK, and becomes a low level at a rising edge of the fourth pulse of the external test clock TCK. The output signal BCK becomes the high level again at a rising edge of the 11th pulse of the external test clock TCK, and becomes the low level again at a rising edge of the 12th pulse of the external test clock TCK. The output signal BCK subsequently repeats transition between the high and low levels in the manner described above.

The seventh waveform from the top in FIG. 7 is a waveform of the output signal (CCK) of the AND circuit 320. An AND operation between the output indicated by the second waveform from the top in FIG. 7, the inversion of the output indicated by the third waveform from the top in FIG. 7, and the output indicated by the fourth waveform from the top in FIG. 7 results in the output indicated by the seventh waveform from the top in FIG. 7. The output signal CCK becomes a high level at a rising edge of the fifth pulse of the external test clock TCK, and becomes a low level at a rising edge of the sixth pulse of the external test clock TCK. The output signal BCK becomes the high level again at a rising edge of the 13th pulse of the external test clock TCK, and becomes the low level again at a rising edge of the 14th pulse of the external test clock TCK. The output signal BCK subsequently repeats transition between the high and low levels in the manner described above.

The eighth waveform from the top in FIG. 7 is a waveform of the output signal (DCK) of the AND circuit 322. An AND operation between the output indicated by the second waveform from the top in FIG. 7, the output indicated by the third waveform from the top in FIG. 7, and the output indicated by the fourth waveform from the top in FIG. 7 results in the output indicated by the eighth waveform from the top in FIG. 7. The output signal DCK becomes a high level at a rising edge of the seventh pulse of the external test clock TCK, and becomes a low level at a rising edge of the eighth pulse of the external test clock TCK. The output signal DCK becomes the high level again at a rising edge of the 15th pulse of the external test clock TCK, and becomes the low level again at a rising edge of the 16th pulse of the external test clock TCK. The output signal DCK subsequently repeats transition between the high and low levels in the manner described above.

Accordingly, since a clock signal is generated using a state machine, a large number of LSI pins are not necessary for multi-phase clock generation. Further, within the LSI, it is not necessary to distribute a multi-phase clock signal over the entirety of the LSI, which prevents concentration in wiring channels. Specifically, if it is difficult to distribute a multi-phase clock signal over the entirety within the LSI, the LSI is divided into several blocks each having a state machine implemented therein, and each of the blocks generates a multi-phase clock signal. In such a case, a reset signal and a test clock signal are distributed over the entirety of the LSI, which alleviates a problem such as concentration in the wiring channels. Furthermore, a scan pulse width can be controlled by adjusting a frequency of a test clock which is input as an operation clock of a state machine and which is adapted to control a period of state transition between states in the state machine. Therefore, if a failure occurs in a scan shift, flexible analysis can be achieved, compared with the generation of a pulse width by a delay time in a circuit. Specifically, it can be determined whether or not the pulse width of a clock signal is sufficient.

Figure 8:
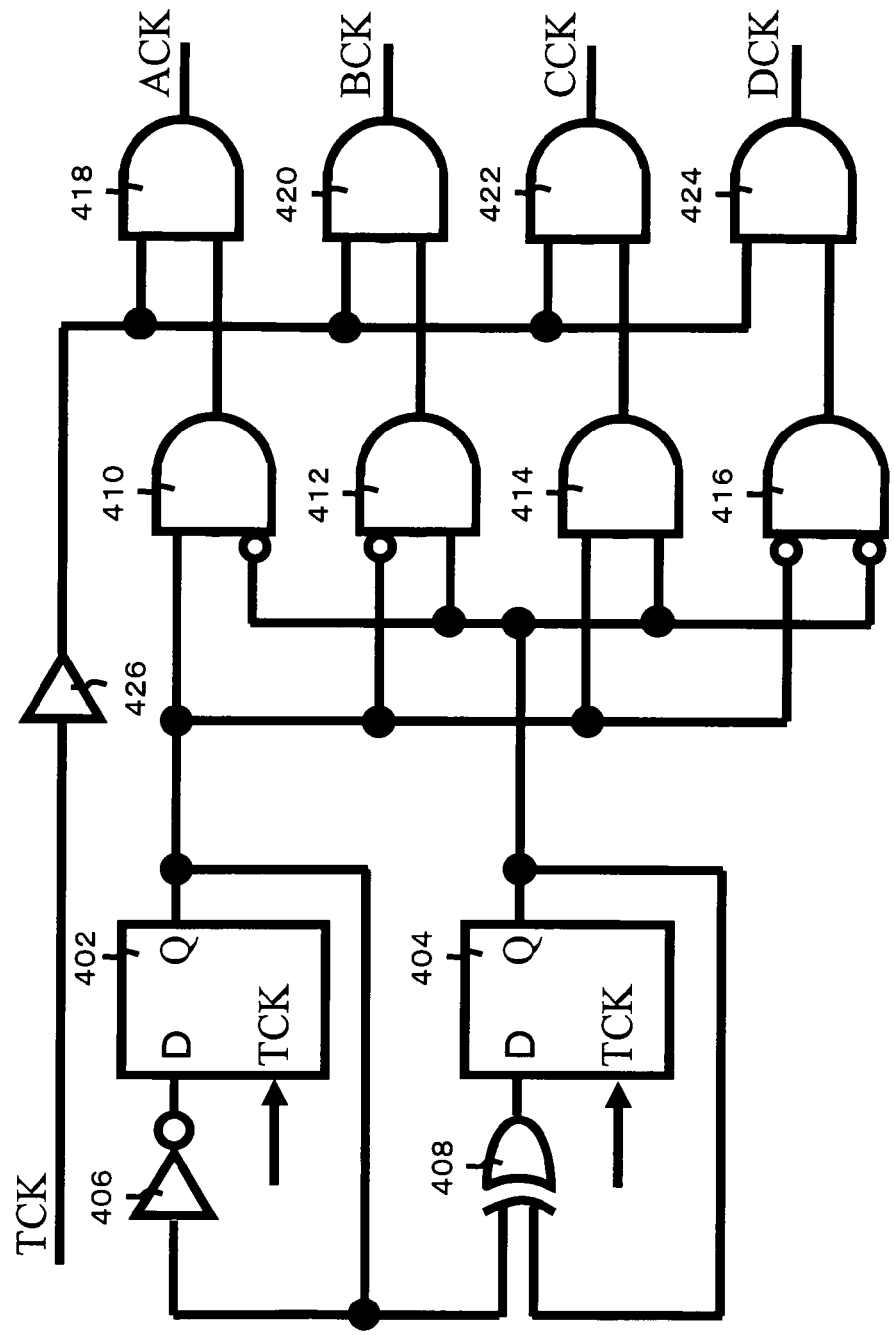
FIG. 8 is a diagram showing a second example of a state machine for generating a clock signal.

FIG. 8 shows an example of a clock generation circuit using a state machine. A flip-flop circuit 402 uses an external test clock TCK as an input timing signal, and latches an output of an inverter 406. A flip-flop circuit 404 uses the external test clock TCK as an input timing signal, and latches an output of an XOR circuit 408.

The inverter 406 inverts the output of the flip-flop circuit 402. An output of the inverter 406 is connected to an input of the flip-flop circuit 402. The XOR circuit 408 performs an XOR operation between the output of the flip-flop circuit 402 and the output of the flip-flop circuit 404, and outputs the operation result. An output of the XOR circuit 408 is connected to an input of the flip-flop circuit 404. A frequency dividing circuit operable to divide the frequency of the external test clock TCK is thus formed.

An AND circuit 410 performs an AND operation between the output of the flip-flop circuit 402 and the inversion of the output of the flip-flop circuit 404, and outputs the operation result. An output of the AND circuit 410 is connected to an input of an AND circuit 418. An AND circuit 412 performs an AND operation between the inversion of the output of the flip-flop circuit 402 and the output of the flip-flop circuit 404, and outputs the operation result. An output of the AND circuit 412 is connected to an input of an AND circuit 420. An AND circuit 414 performs an AND operation between the output of the flip-flop circuit 402 and the output of the flip-flop circuit 404, and outputs the operation result. An output of the AND circuit 414 is connected to an input of the AND circuit 422. An AND circuit 416 performs an AND operation between the inversion of the output of the flip-flop circuit 402 and the inversion of the output of the flip-flop circuit 404, and outputs the operation result. An output of the AND circuit 416 is connected to an input of an AND circuit 424.

The AND circuit 418 performs an AND operation between a signal obtained by delaying the external test clock TCK by a given time and the output of the AND circuit 410, and outputs the operation result. The AND circuit 420 performs an AND operation between the signal obtained by delaying the external test clock TCK by the given time and the output of the AND circuit 412 and outputs the operation result. The AND circuit 422 performs an AND operation between the signal obtained by delaying the external test clock TCK by the given time and the output of the AND circuit 414. The AND circuit 424 performs an AND operation between the signal obtained by delaying the external test clock TCK by the given time and the output of the AND circuit 416.

Figure 9:
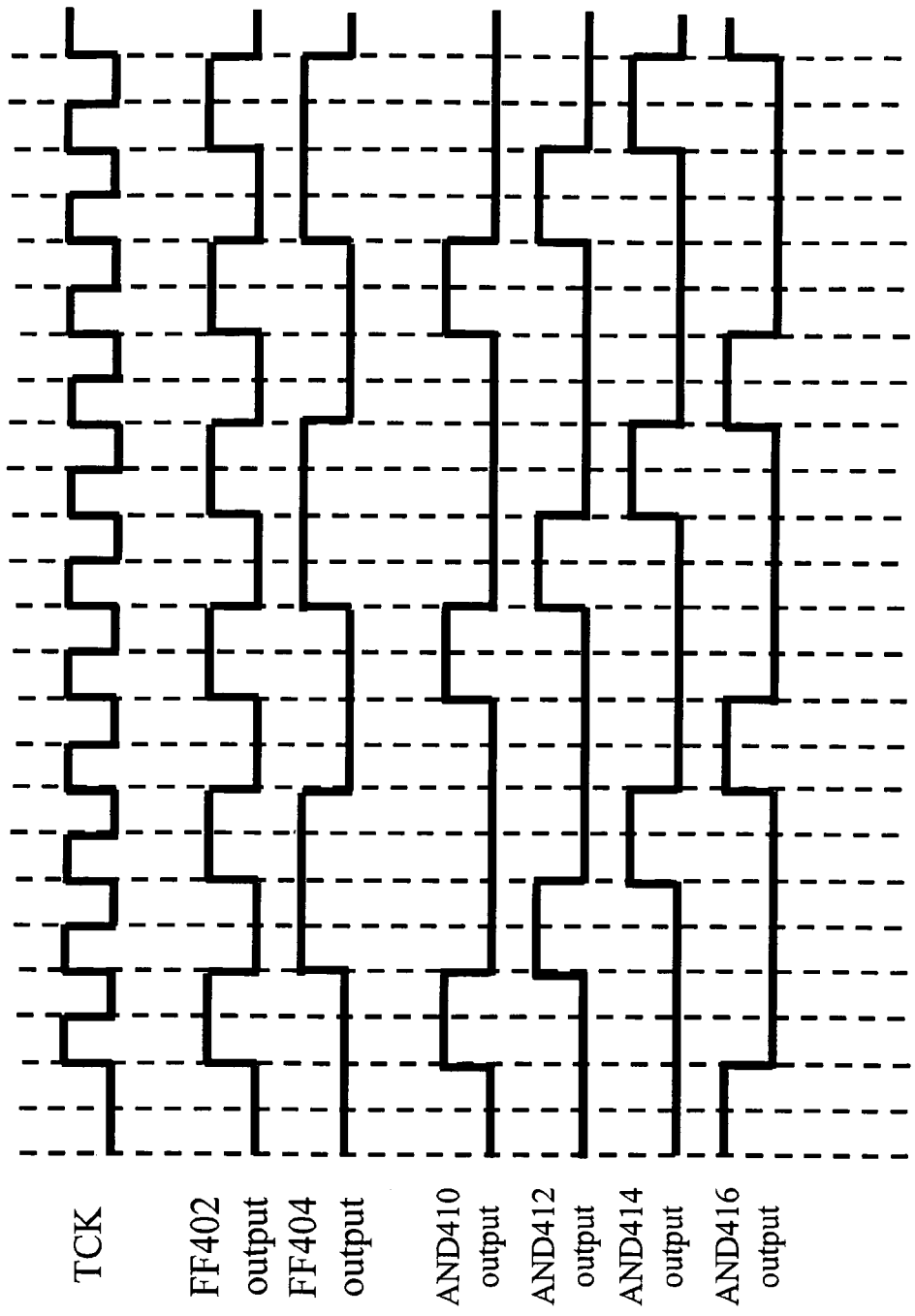
FIG. 9 is a waveform diagram showing a first part of the operation of the state machine.
Figure 10:
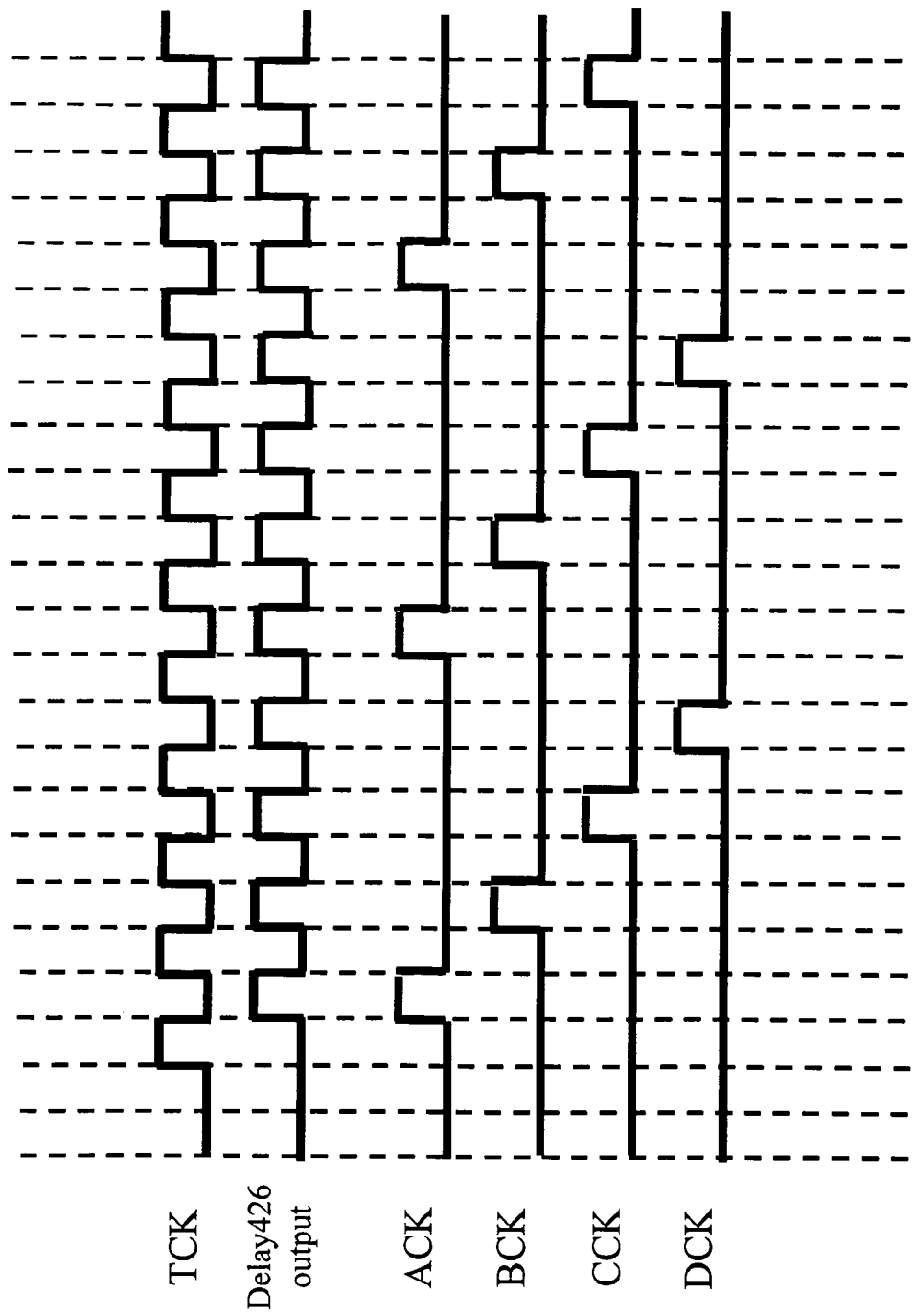
FIG. 10 is a waveform diagram showing a second part of the operation of the state machine.

FIGS. 9 and 10 show waveforms of clock signals generated using a state machine. The top waveform in FIG. 9 indicates the external test clock TCK.

The second waveform from the top in FIG. 9 is a waveform of an output signal of a Q terminal of the flip-flop circuit 402. The third waveform from the top in FIG. 9 indicates an output of a Q terminal of the flip-flop circuit 404. The signal output from the Q terminal of the flip-flop circuit 402 is input to the AND circuits 410 and 414. The signal output from the Q terminal is inverted and also input to the AND circuits 412 and 416. The signal output from the Q terminal of the flip-flop circuit 404 is input to the AND circuits 412 and 414. The signal output from the Q terminal is inverted and also input to the AND circuits 410 and 416.

The fourth waveform from the top in FIG. 9 is a waveform of the output signal of the AND circuit 410. An AND operation between the output indicated by the second waveform from the top in FIG. 9 and the inversion of the output indicated by the third waveform from the top in FIG. 9 results in the output indicated by the fourth waveform from the top in FIG. 9. The output of the AND circuit 410 is input to the AND circuit 418.

The fifth waveform from the top in FIG. 9 is a waveform of the output signal of the AND circuit 412. An AND operation between the inversion of the output indicated by the second waveform from the top in FIG. 9 and the output indicated by the third waveform from the top in FIG. 9 results in the output indicated by the fifth waveform from the top in FIG. 9. The output of the AND circuit 412 is input to the AND circuit 420.

The sixth waveform from the top in FIG. 9 is a waveform of the output signal of the AND circuit 414. An AND operation between the output indicated by the second waveform from the top in FIG. 9 and the output indicated by the third waveform from the top in FIG. 9 results in the output indicated by the sixth waveform from the top in FIG. 9. The output of the AND circuit 414 is input to the AND circuit 422.

The seventh waveform from the top in FIG. 9 is a waveform of the output signal of the AND circuit 416. An AND operation between the inversion of the output indicated by the second waveform from the top in FIG. 9 and the inversion of the output indicated by the third waveform from the top in FIG. 9 results in the output indicated by the seventh waveform from the top in FIG. 9. The output of the AND circuit 416 is input to the AND circuit 424.

The top waveform in FIG. 10 is a waveform of the external test clock TCK. The second waveform from the top in FIG. 10 indicates an output of a hazard-prevention delay 426. The external test clock TCK is delayed by the given time by the hazard-prevention delay 426. The hazard-prevention delay 426 is operable to prevent non-normal scan shift operation due to the large pulse width of the clock generated. The output of the hazard-prevention delay 426 is input to the AND circuits 418, 420, 422, and 424.

The third waveform from the top in FIG. 10 is a waveform of the output signal (ACK) of the AND circuit 418. An AND operation between the output indicated by the fourth waveform from the top in FIG. 9 and the output indicated by the second waveform from the top in FIG. 10 results in the output (ACK) indicated by the third waveform from the top in FIG. 10. The output signal ACK becomes a high level at a falling edge of the first pulse of the external test clock TCK, and becomes a low level at a rising edge of the second pulse of the external test clock TCK. The output signal ACK becomes the high level again at a falling edge of the fifth pulse of the external test clock TCK, and becomes the low level at a rising edge of the sixth pulse of the external test clock TCK. The output signal ACK subsequently repeats transition between the high and low levels in the manner described above.

The fourth waveform from the top in FIG. 10 is a waveform of the output signal (BCK) of the AND circuit 420. An AND operation between the output indicated by the fifth waveform from the top in FIG. 9 and the output indicated by the second waveform from the top in FIG. 10 results in the output (BCK) indicated by the fourth waveform from the top in FIG. 10. The output signal BCK becomes a high level at a falling edge of the second pulse of the external test clock TCK, and becomes a low level at a rising edge of the third pulse of the external test clock TCK. The output signal BCK becomes the high level again at a falling edge of the sixth pulse of the external test clock TCK, and becomes the low level at a rising edge of the seventh pulse of the external test clock TCK. The output signal BCK subsequently repeats transition between the high and low levels in the manner described above.

The fifth waveform from the top in FIG. 10 is a waveform of the output signal (CCK) of the AND circuit 422. An AND operation between the output indicated by the sixth waveform from the top in FIG. 9 and the output indicated by the second waveform from the top in FIG. 10 results in the output (CCK) indicated by the fifth waveform from the top in FIG. 10. The output signal CCK becomes a high level at a falling edge of the third pulse of the external test clock TCK, and becomes a low level at a rising edge of the fourth pulse of the external test clock TCK. The output signal CCK becomes the high level again at a falling edge of the seventh pulse of the external test clock TCK, and becomes the low level at a rising edge of the eighth pulse of the external test clock TCK. The output signal CCK subsequently repeats transition between the high and low levels in the manner described above.

The sixth waveform from the top in FIG. 10 is a waveform of the output signal (DCK) of the AND circuit 424. An AND operation between the output indicated by the seventh waveform from the top in FIG. 9 and the output indicated by the second waveform from the top in FIG. 10 results in the output (DCK) indicated by the sixth waveform from the top in FIG. 10. The output signal DCK becomes a high level at a falling edge of the fourth pulse of the external test clock TCK, and becomes a low level at a rising edge of the fifth pulse of the external test clock TCK. The output signal DCK becomes the high level again at a falling edge of the eighth pulse of the external test clock TCK, and becomes the low level at a rising edge of the ninth pulse of the external test clock TCK. The output signal DCK subsequently repeats transition between the high and low levels in the manner described above.

Accordingly, since both an up edge and a down edge of the test clock TCK are used, a test time can be reduced. This prevents an increase in test time for a number of pulses of a test clock due to the lower speed of the signal from the outside of the LSI than that from the inside of the LSI.

Figure 11:
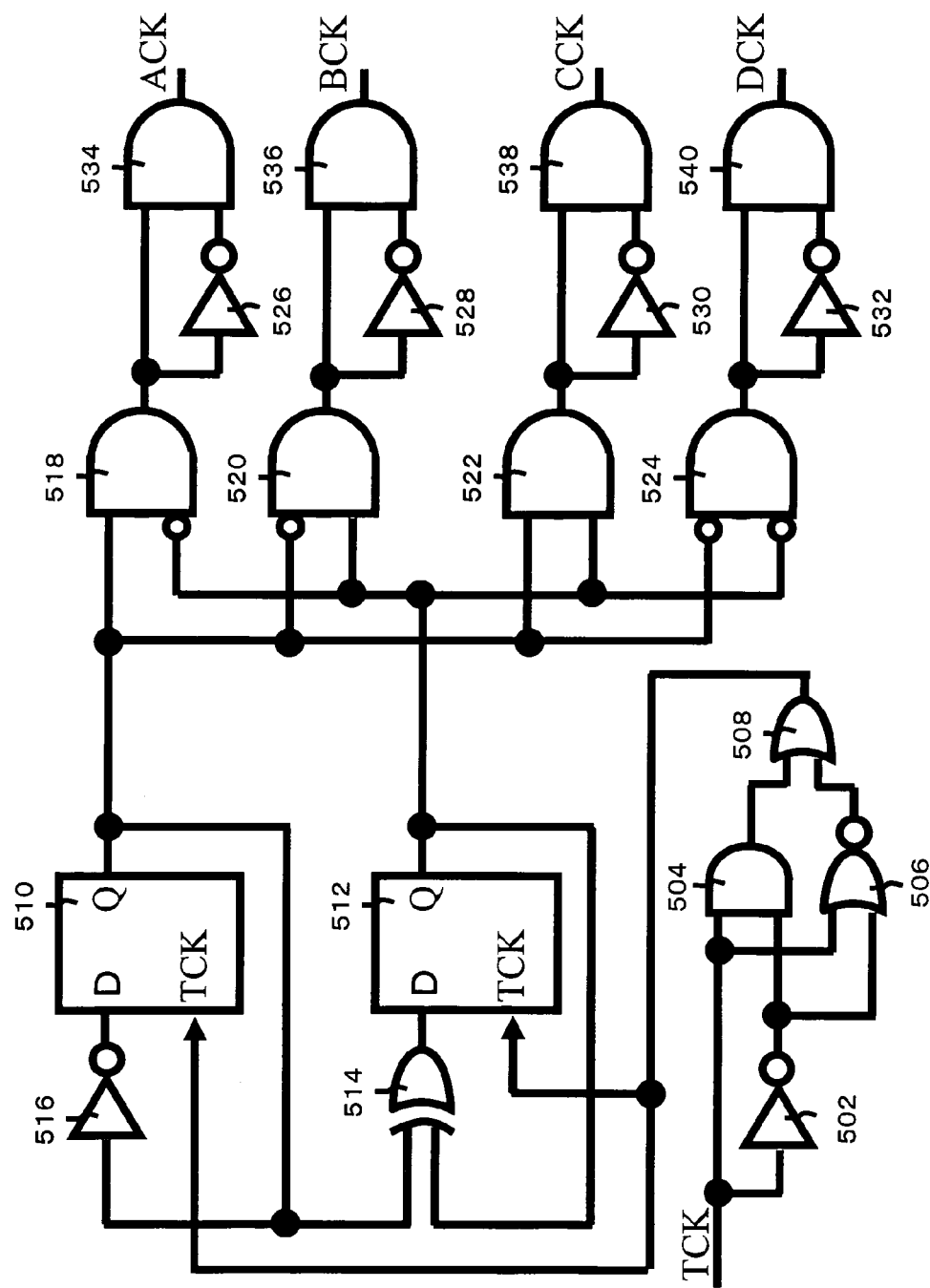
FIG. 11 is a diagram showing chopper circuits and state machine for generating a clock signal.

FIG. 11 shows an example of a clock generation circuit using chopper circuits and a state machine. An inverter 502 inverts an input test clock TCK. An output of the inverter 502 is connected to an input of an AND circuit 504. The output of the inverter 502 is also connected to the input of a Not-OR (NOR) circuit 506. The AND circuit 504 performs an AND operation between the input test clock TCK and the output of the inverter 502, and outputs the operation result. An output of the AND circuit 504 is connected to an input of an OR circuit 508. The NOR circuit 506 performs a NOR operation between the input test clock TCK and the output of the inverter 502, and outputs the operation result. An output of the NOR circuit 506 is connected to an input of the OR circuit 508. The OR circuit 508 performs an OR operation between the output of the AND circuit 504 and the output of the NOR circuit 506. An output of the OR circuit 508 is connected to inputs of flip-flop circuits 510 and 512. The inverter 502, the AND circuit 504, the NOR circuit 506, and the OR circuit 508 form a multiplier circuit.

The flip-flop circuit 512 uses the output of the OR circuit 508 as an input timing signal, and latches an output of an XOR circuit 514. The flip-flop circuit 510 uses the output of the OR circuit 508 as an input timing signal, and latches an output of an inverter 516.

The XOR circuit 514 performs an XOR operation between the output of the flip-flop circuit 510 and the output of the flip-flop circuit 512. An output of the XOR circuit 514 is connected to an input of the flip-flop circuit 510. The inverter 516 inverts the output of the flip-flop circuit 512. An output of the inverter 516 is connected to an input of the flip-flop circuit 510. A frequency dividing circuit operable to divide the frequency of a multiplied clock signal is thus formed.

An AND circuit 518 performs an AND operation between the output of the flip-flop circuit 510 and the inversion of the output of the flip-flop circuit 512. An output of the AND circuit 518 is connected to an input of an inverter 526 and an input of an AND circuit 534. The inverter 526 and the AND circuit 534 forms a first chopper circuit. An AND circuit 520 performs an AND operation between the inversion of the output of the flip-flop circuit 510 and the output of the flip-flop circuit 512. An output of the AND circuit 520 is connected to an input of an inverter 528 and an input of an AND circuit 536. The inverter 528 and the AND circuit 536 forms a second chopper circuit. An AND circuit 522 performs an AND operation between the output of the flip-flop circuit 510 and the output of the flip-flop circuit 512. An output of the AND circuit 522 is connected to an input of an inverter 530 and an input of an AND circuit 538. The inverter 530 and the AND circuit 538 forms a third chopper circuit. An AND circuit 524 performs an AND operation between the inversion of the output of the flip-flop circuit 510 and the inversion of the output of the flip-flop circuit 512. An output of the AND circuit 524 is connected to an input of an inverter 532 and an input of an AND circuit 540. The inverter 532 and the AND circuit 540 forms a fourth chopper circuit.

The inverter 526 inverts the output of the AND circuit 518. An output of the inverter 526 is connected to an input of the AND circuit 534. The inverter 528 inverts the output of the AND circuit 520. An output of the inverter 528 is connected to an input of the AND circuit 536. The inverter 530 inverts the output of the AND circuit 522. An output of the inverter 530 is connected to an input of the AND circuit 538. The inverter 532 inverts the output of the AND circuit 524. An output of the inverter 532 is connected to an input of the AND circuit 540.

FIGS. 12, 13, 14, and 15 show waveforms of clock signals generated using chopper circuits and a state machine. The top waveform in FIG. 12 indicates the external test clock TCK. The external test clock TCK is input to the inverter 502 and the AND circuit 504.

Figure 12:
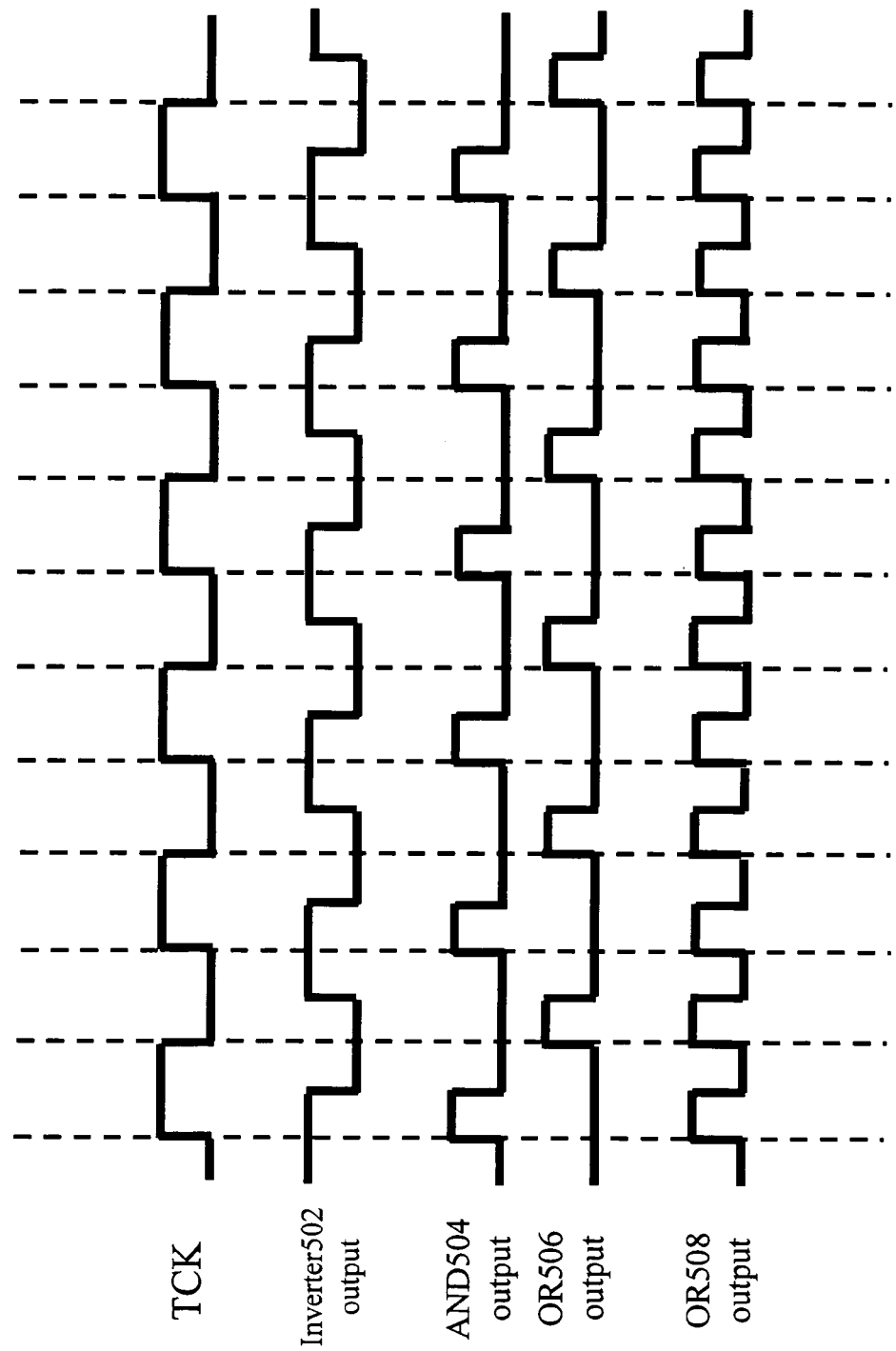
FIG. 12 is a waveform diagram showing a first part of the operation of the chopper circuits and state machine.

The second waveform from the top in FIG. 12 is a waveform of the output signal of the inverter 502. The output of the inverter 502 is input to the AND circuit 504 and the NOR circuit 506.

The third waveform from the top in FIG. 12 is a waveform of the output signal of the AND circuit 504. An AND operation between the output indicated by the top waveform in FIG. 12 and the output indicated by the second waveform from the top in FIG. 12 results in the output indicated by the third waveform from the top in FIG. 12. The output of the AND circuit 504 is input to the OR circuit 508.

The fourth waveform from the top in FIG. 12 is a waveform of the output signal of the NOR circuit 506. An NOR operation between the output indicated by the top waveform in FIG. 12 and the output indicated by the second waveform from the top in FIG. 12 results in the output indicated by the fourth waveform from the top in FIG. 12. The output of the NOR circuit 506 is input to the OR circuit 508.

The fifth waveform from the top in FIG. 12 is a waveform of the output signal of the OR circuit 508. An OR operation between the output indicated by the third waveform from the top in FIG. 12 and the output indicated by the fourth waveform from the top in FIG. 12 results in the output indicated by the fifth waveform from the top in FIG. 12. The output of the OR circuit 508 is input to the flip-flop circuits 510 and 512.

Figure 13:
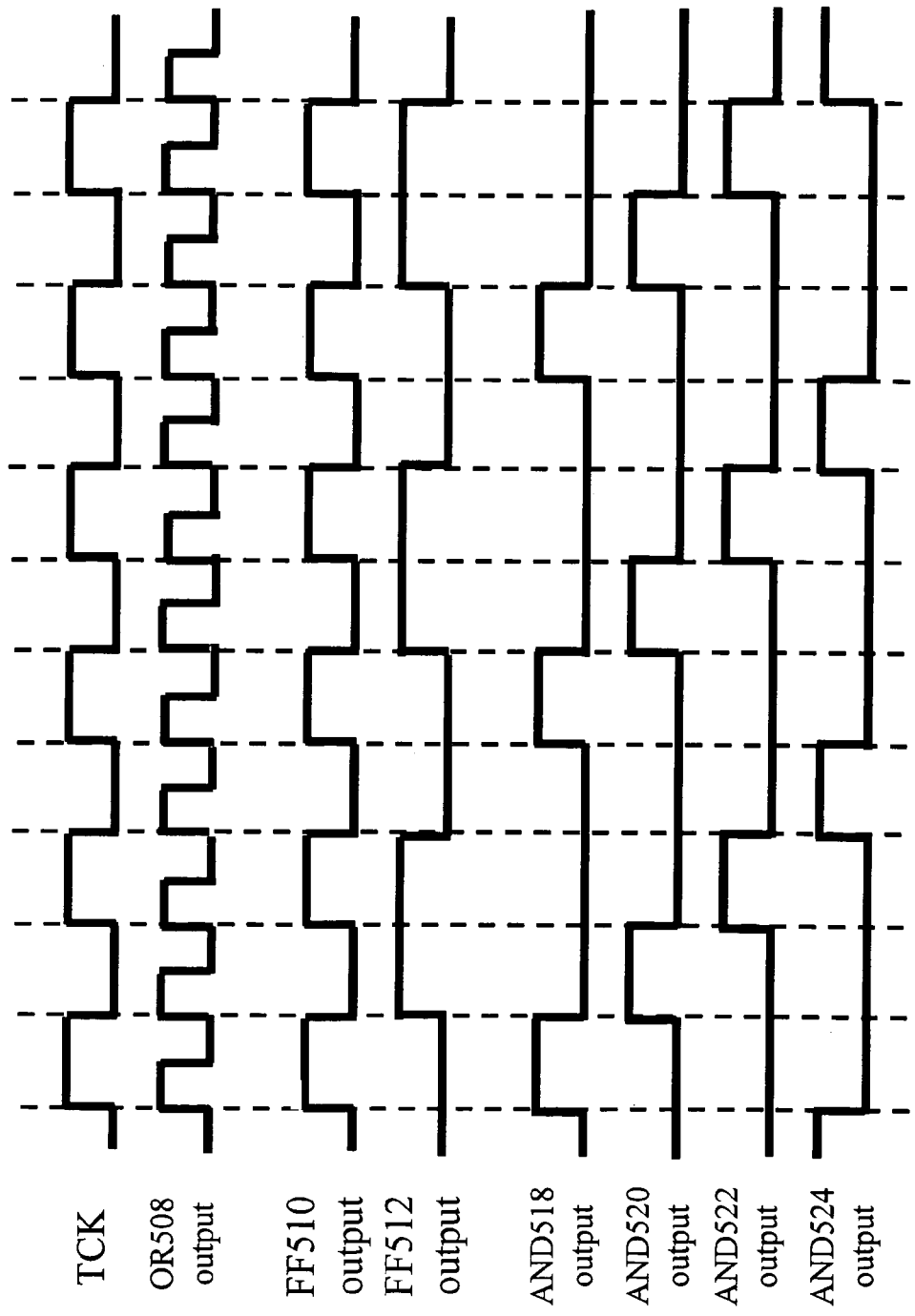
FIG. 13 is waveform diagram showing a second part of the operation of the chopper circuits and state machine.

The third waveform from the top in FIG. 13 is a waveform of an output signal of a Q terminal of the flip-flop circuit 510. The fourth waveform from the top in FIG. 13 is a waveform of an output of a Q terminal of the flip-flop circuit 512. The signal output from the Q terminal of the flip-flop circuit 510 is input to the AND circuits 518 and 522. The signal output from the Q terminal is inverted and also input to the AND circuits 520 and 524. The signal output from the Q terminal of the flip-flop circuit 512 is input to the AND circuits 520 and 522. The signal output from the Q terminal is inverted and also input to the AND circuits 518 and 524.

The fifth waveform from the top in FIG. 13 is a waveform of the output signal of the AND circuit 518. An AND operation between the output indicated by the third waveform from the top in FIG. 13 and the inversion of the output indicated by the fourth waveform from the top in FIG. 13 results in the output indicated by the fifth waveform from the top in FIG. 13. The output of the AND circuit 518 is input to the inverter 526 and the AND circuit 534.

The sixth waveform from the top in FIG. 13 is a waveform of the output signal of the AND circuit 520. An AND operation between the inversion of the output indicated by the third waveform from the top in FIG. 13 and the output indicated by the fourth waveform from the top in FIG. 13 results in the output indicated by the sixth waveform from the top in FIG. 13. The output of the AND circuit 520 is input to the inverter 528 and the AND circuit 536.

The seventh waveform from the top in FIG. 13 is a waveform of the output signal of the AND circuit 522. An AND operation between the output indicated by the third waveform from the top in FIG. 13 and the output indicated by the fourth waveform from the top in FIG. 13 results in the output indicated by the seventh waveform from the top in FIG. 13. The output of the AND circuit 522 is input to the inverter 530 and the AND circuit 538.

The eighth waveform from the top in FIG. 13 is a waveform of the output signal of the AND circuit 524. An AND operation between the inversion of the output indicated by the third waveform from the top in FIG. 13 and the inversion of the output indicated by the fourth waveform from the top in FIG. 13 results in the output indicated by the eighth waveform from the top in FIG. 13. The output of the AND circuit 524 is input to the inverter 532 and the AND circuit 540.

Figure 14:
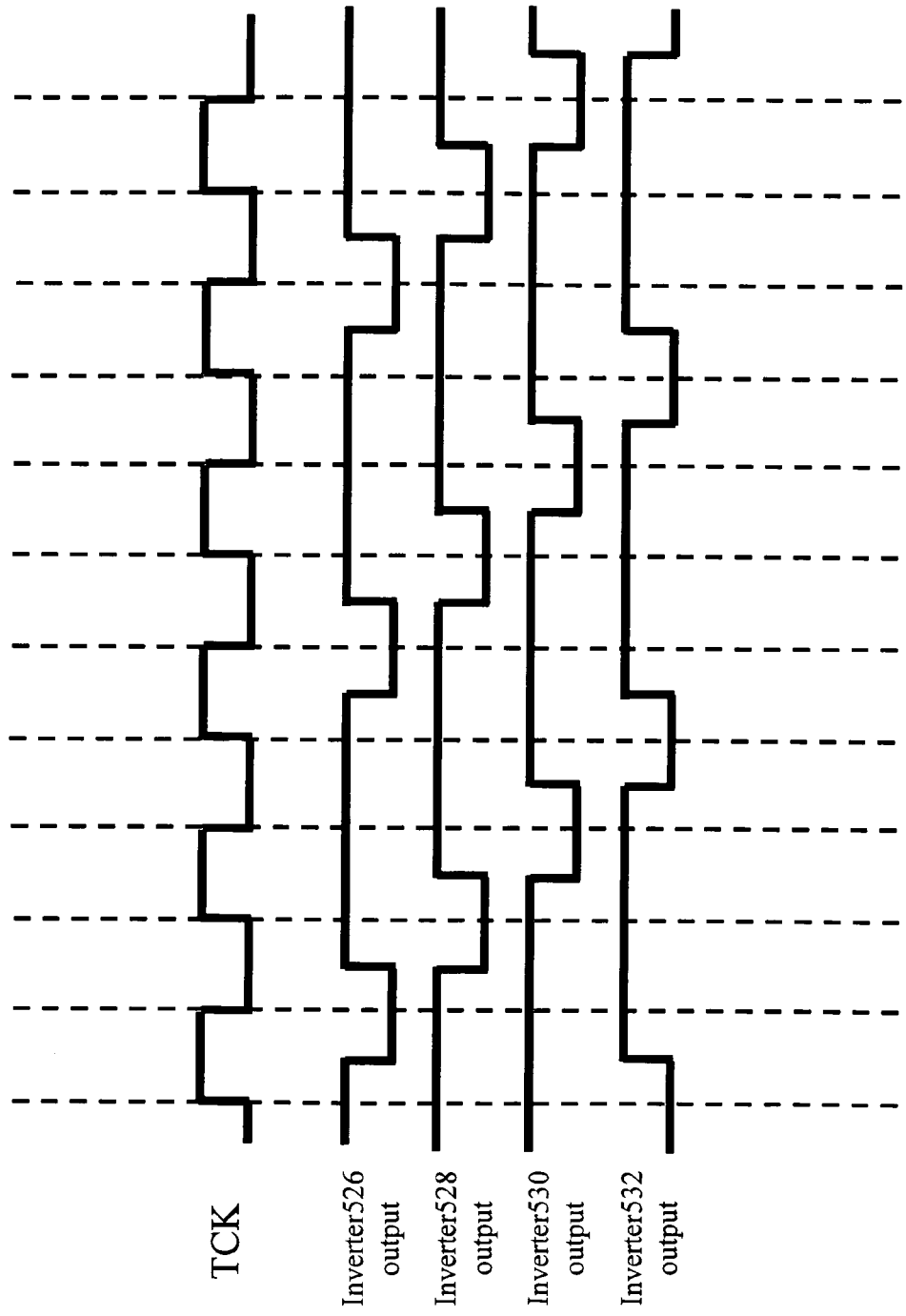
FIG. 14 is a waveform diagram showing a third part of the operation of the chopper circuits and state machine.

The second waveform from the top in FIG. 14 is a waveform of the output signal of the inverter 526. The third waveform from the top in FIG. 14 indicates the output of the inverter 528. The fourth waveform from the top in FIG. 14 indicates the output of the inverter 530. The fifth waveform from the top in FIG. 14 indicates the output of the inverter 532.

Figure 15:
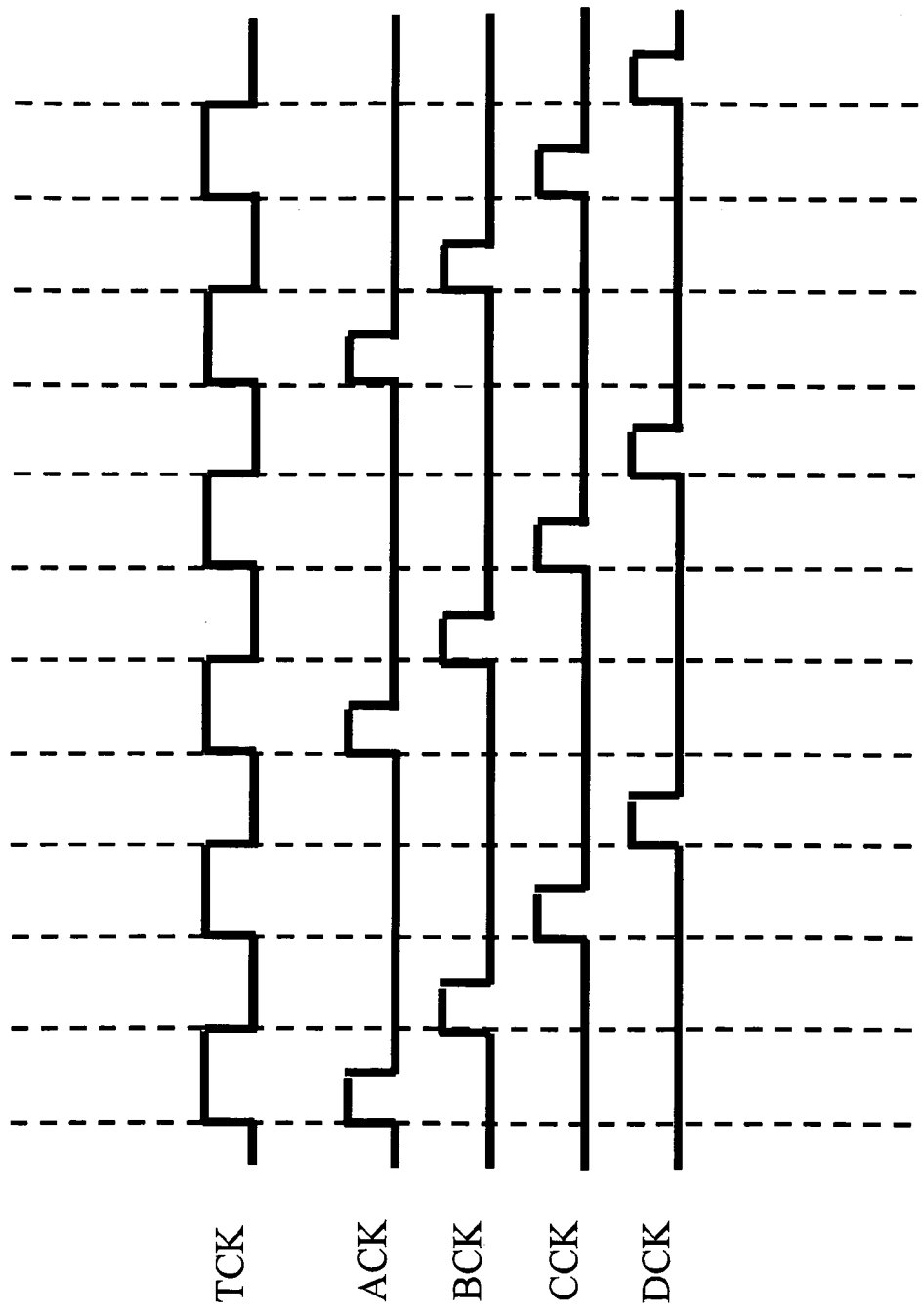
FIG. 15 is a waveform diagram showing a fourth part of the operation of the chopper circuits and state machine.

The second waveform from the top in FIG. 15 is a waveform of the output signal (ACK) of the AND circuit 534. An AND operation between the output indicated by the fifth waveform from the top in FIG. 13 and the output indicated by the second waveform from the top in FIG. 14 results in the output (ACK) indicated by the second waveform from the top in FIG. 15. The output signal ACK becomes a high level at a rising edge of the first pulse of the external test clock TCK, becomes the high level at a rising edge of the third pulse of the external test clock TCK, and becomes the high level at a rising edge of the fifth pulse of the external test clock TCK. The output signal ACK subsequently repeats transition between the high and low levels in the manner described above.

The third waveform from the top in FIG. 15 indicates the output (BCK) of the AND circuit 536. An AND operation between the output indicated by the sixth waveform from the top in FIG. 13 and the output indicated by the third waveform from the top in FIG. 14 results in the output (BCK) indicated by the third waveform from the top in FIG. 15. The output signal BCK becomes a high level at a falling edge of the first pulse of the external test clock TCK, becomes the high level at a falling edge of the third pulse of the external test clock TCK, and becomes the high level at a falling edge of the fifth pulse of the external test clock TCK. The output signal BCK subsequently repeats transition between the high and low levels in the manner described above.

The fourth waveform from the top in FIG. 15 is a waveform of the output signal (CCK) of the AND circuit 538. An AND operation between the output indicated by the seventh waveform from the top in FIG. 13 and the output indicated by the fourth waveform from the top in FIG. 14 results in the output (CCK) indicated by the fourth waveform from the top in FIG. 15. The output signal CCK becomes a high level at a rising edge of the second pulse of the external test clock TCK, becomes the high level at a rising edge of the fourth pulse of the external test clock TCK, and becomes the high level at a rising edge of the sixth pulse of the external test clock TCK. The output signal CCK subsequently repeats transition between the high and low levels in the manner described above.

The fifth waveform from the top in FIG. 15 indicates the output (DCK) of the AND circuit 540. An AND operation between the output indicated by the eighth waveform from the top in FIG. 13 and the output indicated by the fifth waveform from the top in FIG. 14 results in the output (DCK) indicated by the fifth waveform from the top in FIG. 15. The output signal DCK becomes a high level at a falling edge of the second pulse of the external test clock TCK, becomes the high level at a falling edge of the fourth pulse of the external test clock TCK, and becomes the high level at a falling edge of the sixth pulse of the external test clock TCK. The output signal DCK subsequently repeats transition between the high and low levels in the manner described above.

According to the embodiment, some of master latches are connected to form a scan chain. This allows a reduction in the number of circuits to reduce the power consumption of the scan chain. Further, since the power consumption is reduced, the amount of current flowing in the latch circuits can be reduced. The reduction in the amount of current can prevent physical deterioration of a semiconductor device, which is caused by electromigration. Electromigration is a phenomenon in which the flow of electrons causes metallic ions in wiring lines to migrate to a silicon substrate over time to cause failure such as short-circuit failure, increase in resistance, and open-circuit failure.

Figure 16:
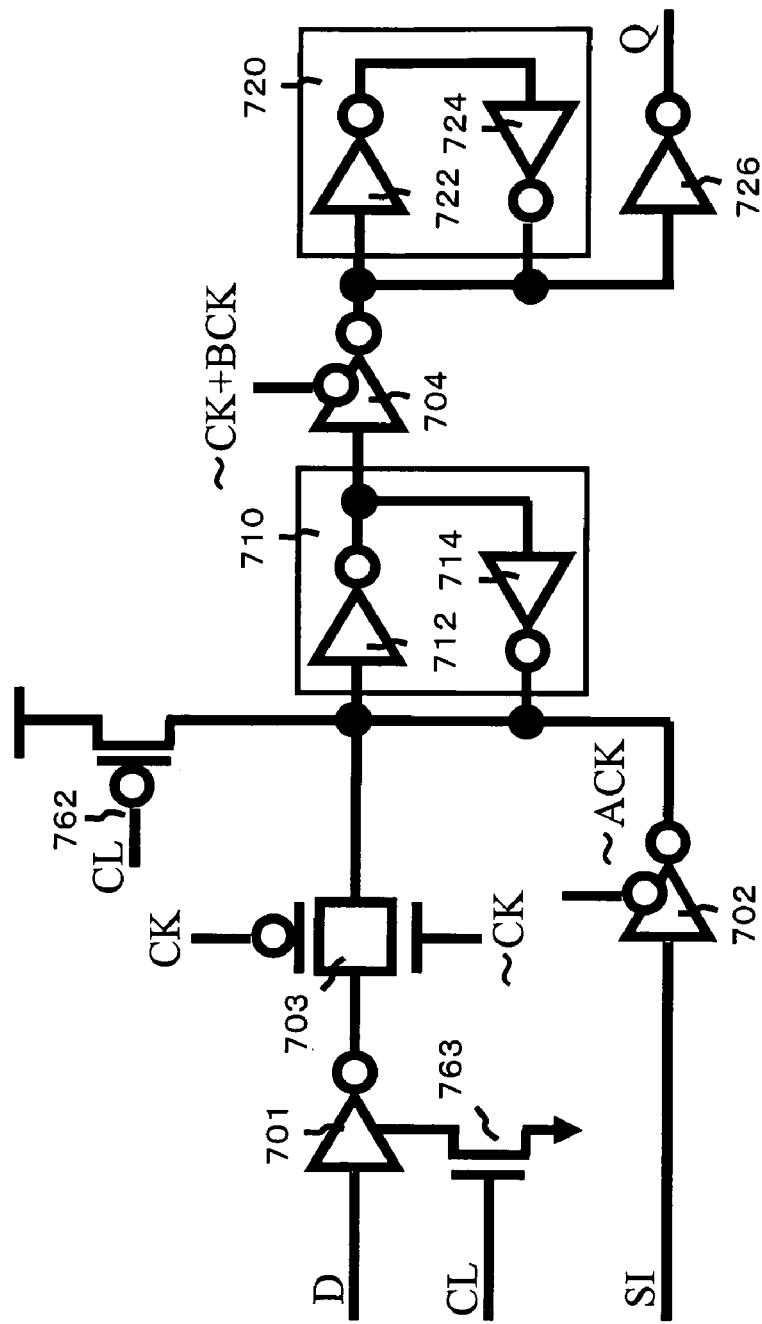
FIG. 16 is a circuit diagram of a flip-flop circuit.
Figure 17:
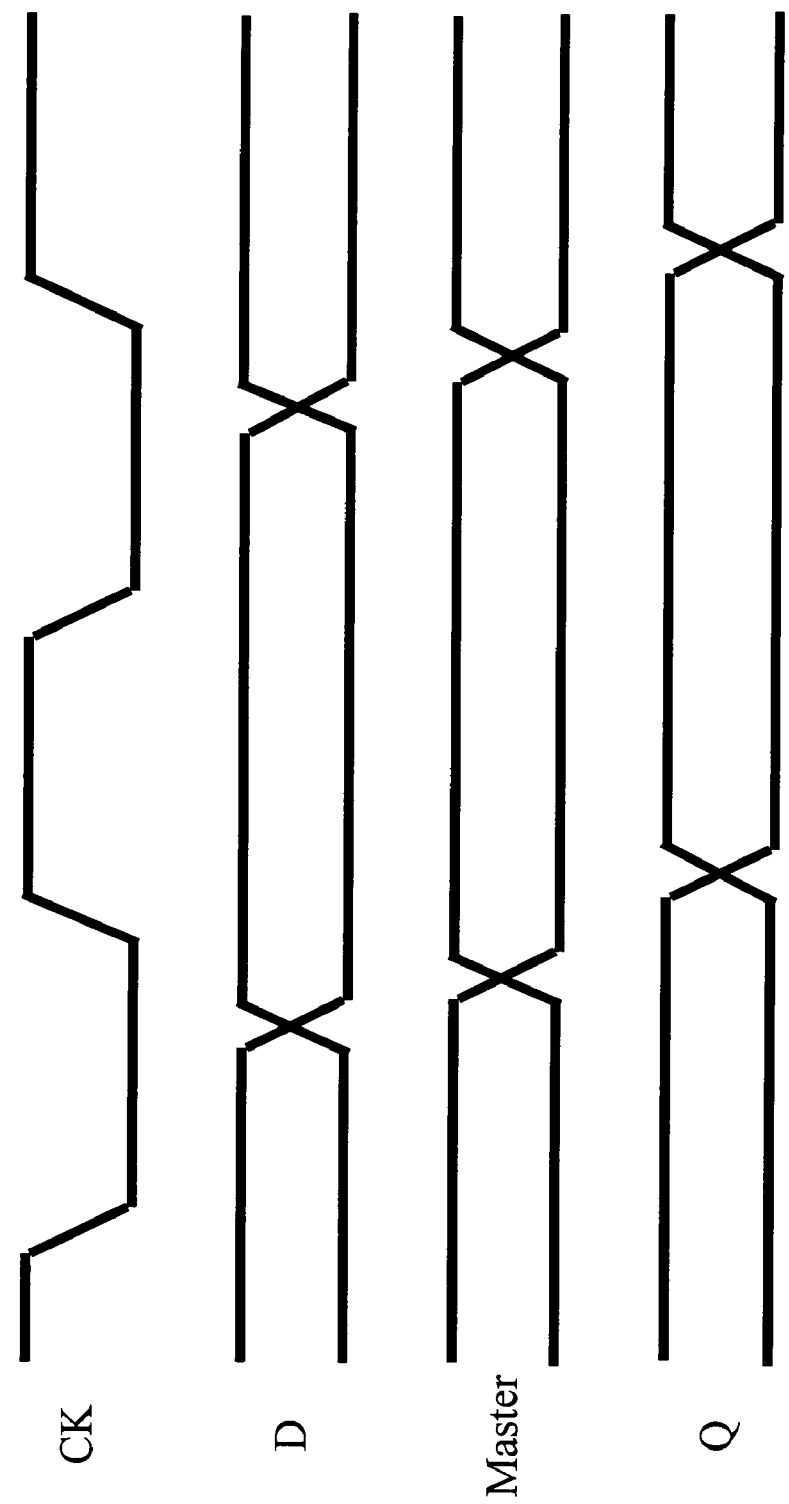
FIG. 17 is a waveform diagram showing the operation of the flip-flop circuit.

Finally, the effectiveness of the embodiment will be described in the context of, for example, a scan chain formed by a flip-flop circuit shown in FIG. 16. The flip-flop circuit includes a master latch 710 and a slave latch 720. The master latch 710 includes inverters 712 and 714. An output of the inverter 712 is connected to an input of the inverter 714. An output of the inverter 714 is connected to an input of the inverter 712. Thus, a sequential circuit is formed. The master latch 710 is connected to an inverter 702 having an enable terminal. Scan-in data SI is input to the inverter 702 having the enable terminal. The master latch 710 is also connected to an inverter 704 having an enable terminal. When a clock signal is input from outside, the inverter 704 having the enable terminal outputs the output of the master latch 710 to the slave latch 720. The slave latch 720 includes inverters 722 and 724. An output of the inverter 722 is connected to an input of the inverter 724. An output of the inverter 724 is connected to an input of the inverter 722. Thus, a latch circuit is formed. The output of the inverter 724 is output via an inverter 726. The master latch 710 is connected to a transfer gate 703, a clear switch 762, and the inverter 702. The transfer gate 703 is connected to an inverter 701. The inverter 701 is connected to an n-type transistor 763. Data (D), which is data to be held, is input to the inverter 701. The inverter 701 outputs the input data to the transfer gate 703. When a clock signal is input from outside, the transfer gate 703 outputs the data output from the inverter 701 to the master latch 710. The n-type transistor 763 disconnects a path from ground to the output of the inverter 701. The clear switch 762 is short-circuited to a power supply potential to clear the data held in the master latch 710 or the like. As shown in FIG. 17, in response to an up edge of a clock CK as a trigger, an output Q changes.

Figure 18:
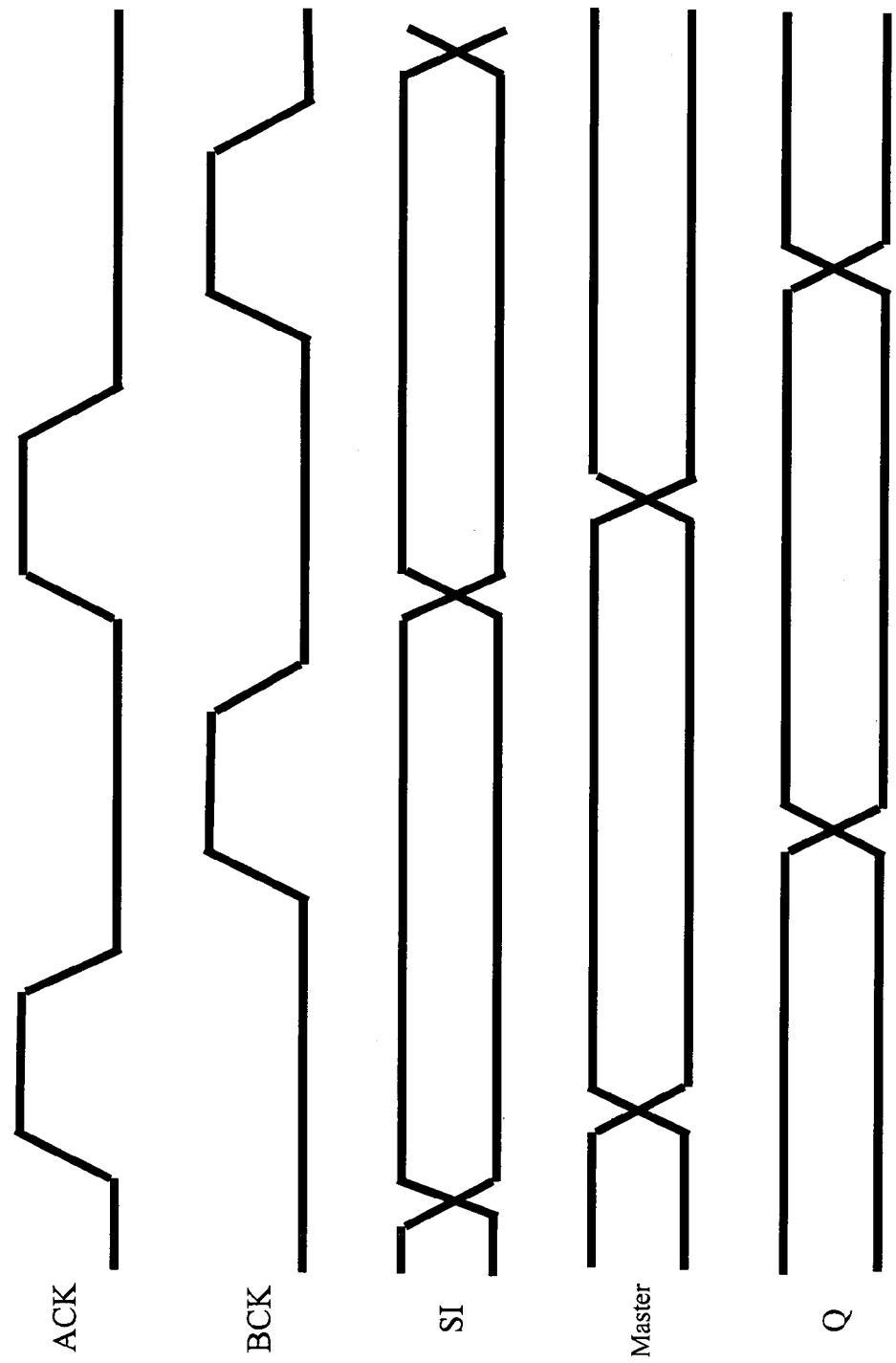
FIG. 18 is a waveform diagram showing the operation of the flip-flop circuit when a scan chain is formed.
Figure 19:
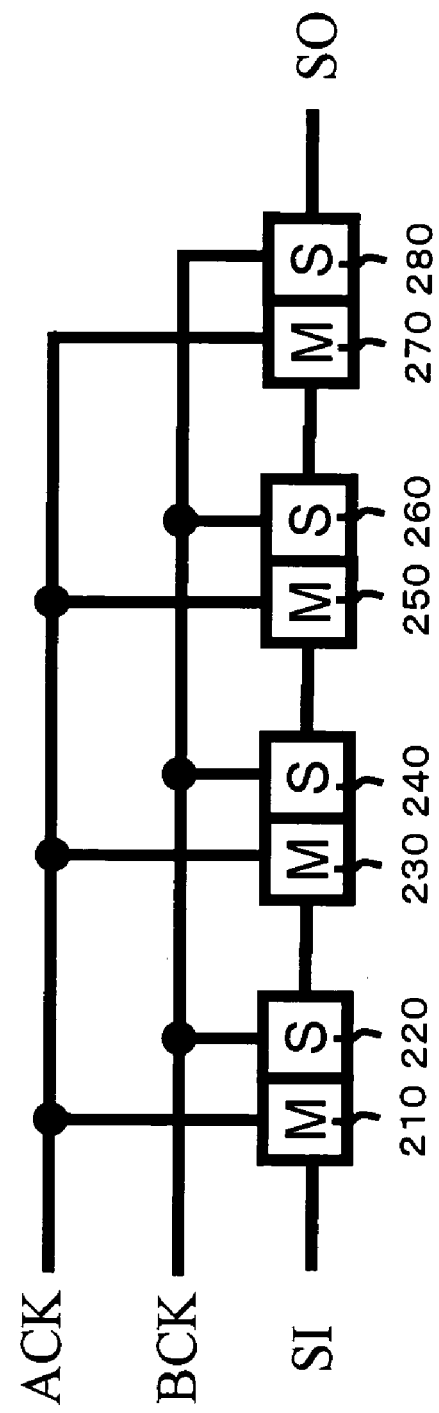
FIG. 19 is a diagram showing a structure of a scan chain.
Figure 20:
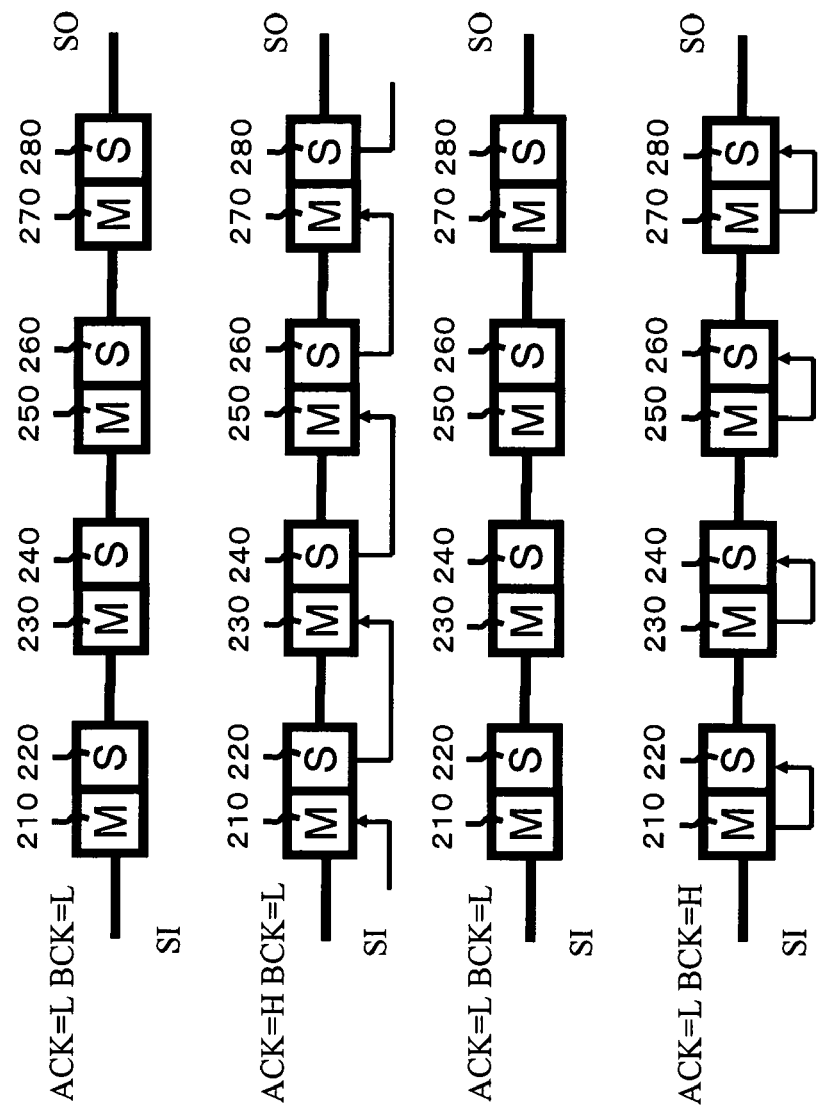
FIG. 20 is a diagram showing the operation of the scan chain.

FIG. 19 shows a structure of a scan chain. FIG. 20 shows the operation of the scan chain. As shown in FIG. 19, the scan chain includes, for example, master latches 210, 230, 250, and 270, and slave latches 220, 240, 260, and 280. As shown in FIG. 18, a clock ACK for controlling the master latches 210, 230, 250, and 270, and a clock BCK for controlling the slave latches 220, 240, 260, and 280 are alternately turned on, and a signal propagates from an input SI to an output Q. The signal of the output Q is input to an input SI of a subsequent flip-flop circuit. Thus, a scan chain is formed.

As shown in FIG. 20, when both the clocks ACK and BCK are in a low level, the master latches 210, 230, 250, and 270 and slave latches 220, 240, 260, and 280 hold data. When the clock ACK is in a high level and the clock BCK is in a low level, the master latch 210 latches the input SI, the master latch 230 latches the output of the slave latch 220, the master latch 250 latches the output of the slave latch 240, the master latch 270 latches the output of the slave latch 260, and the slave latch 280 outputs the held signal as output data SO. When the clock ACK is in a low level and the clock BCK is in a high level, the slave latch 220 latches the output of the master latch 210, the slave latch 240 latches the output of the master latch 230, the slave latch 260 latches the output of the master latch 250, and the slave latch 280 latches the output of the master latch 270.

This embodiment, on the other hand, provides a circuit in which a single slave latch is provided for two or more master latches used for system operation. In a circuit according to this embodiment, in which a single slave latch is provided for three master latches, a total of four latches, which is given by (the number of master latches)×3+(the number of slave latches)×1, are used. Thus, the number of circuits can be reduced to ⅔, compared with the circuit shown in FIG. 19, in which a total of six latches, which is given by {(the number of master latches)+(the number of slave latches)}×3, are used.

Figure 21:
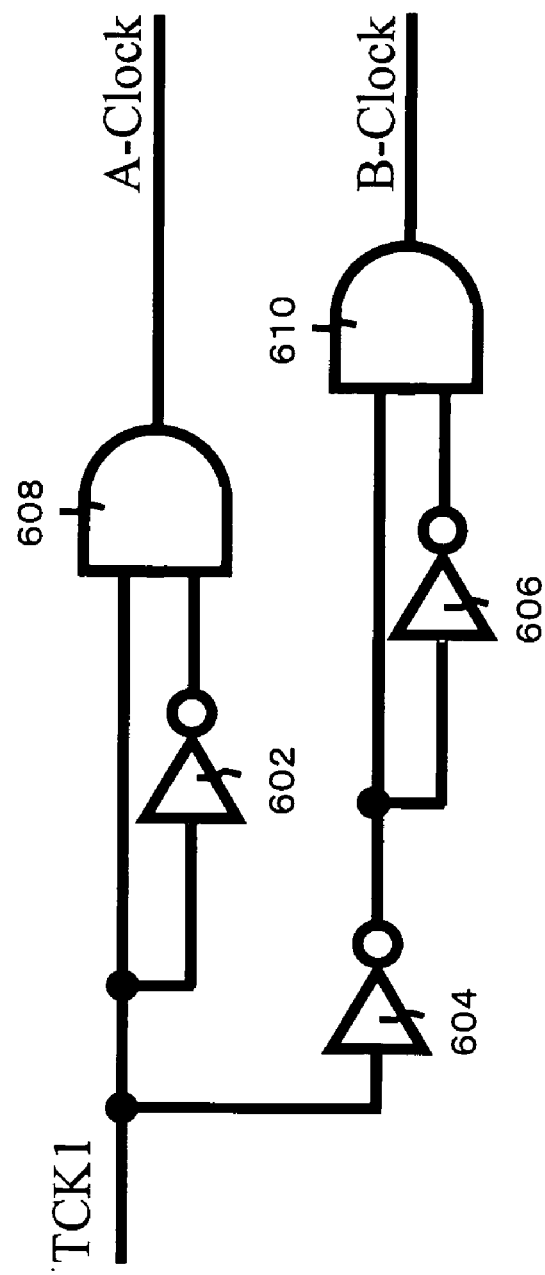
FIG. 21 is a circuit diagram showing a first example of a circuit for generating a clock signal.
Figure 22:
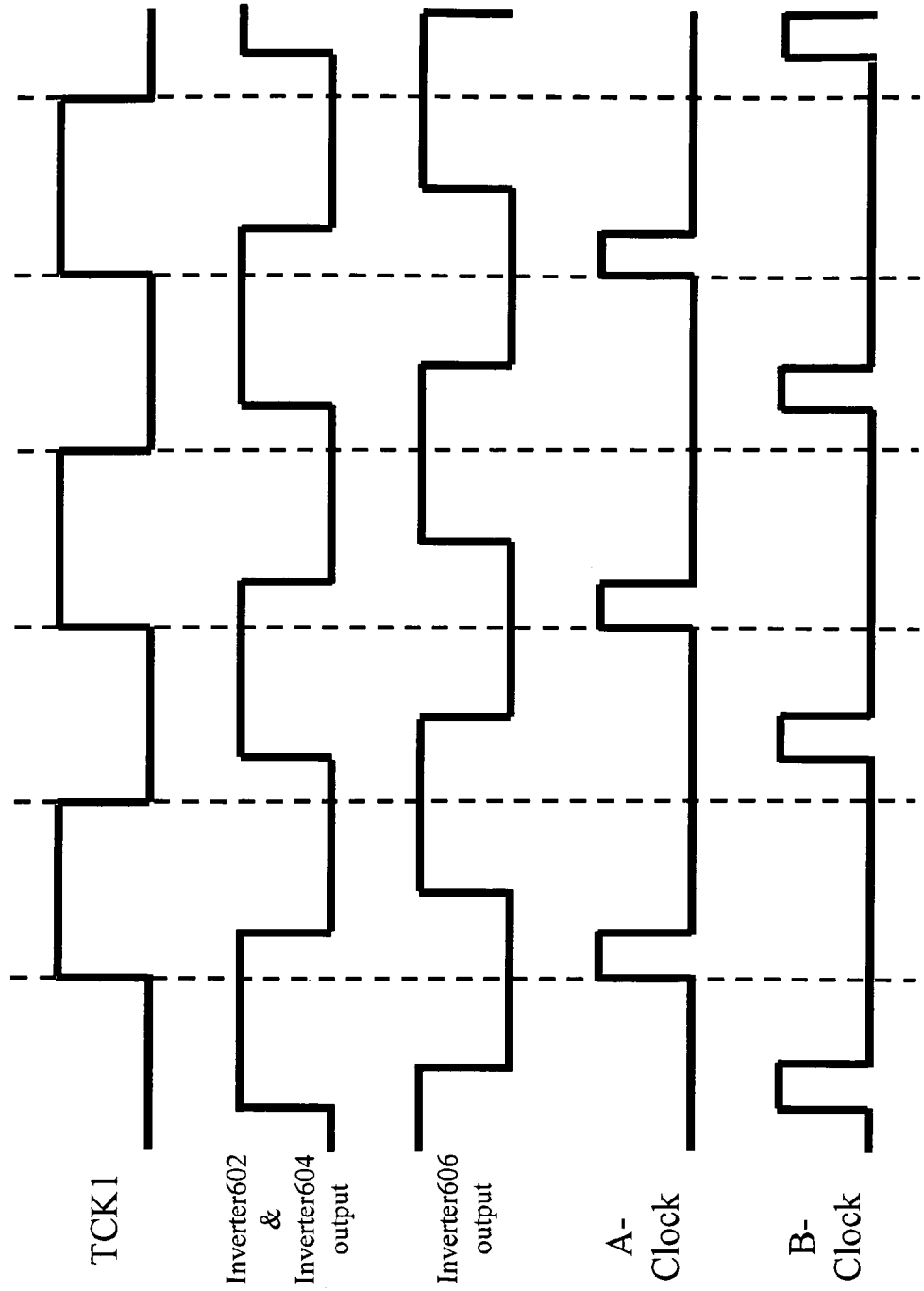
FIG. 22 is a waveform diagram showing the operation of the circuit for generating a clock signal.
Figure 23:
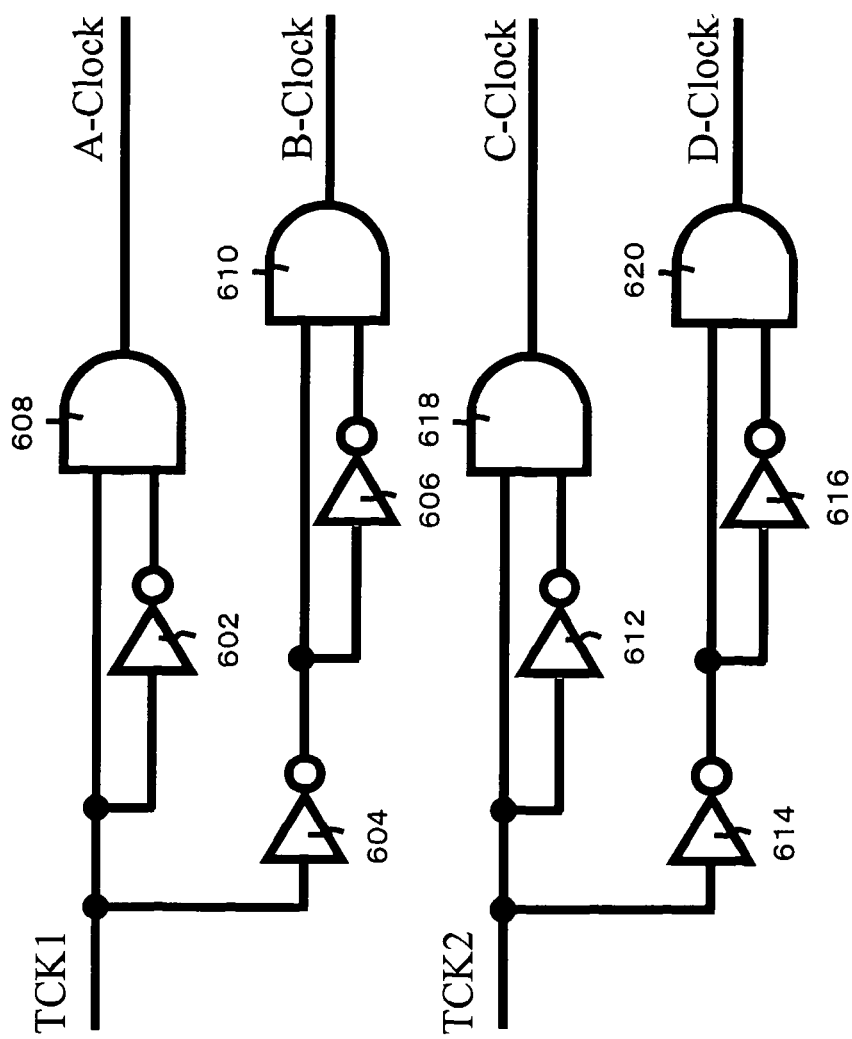
FIG. 23 is a circuit diagram showing a second example of a circuit for generating a clock signal.
Figure 24:
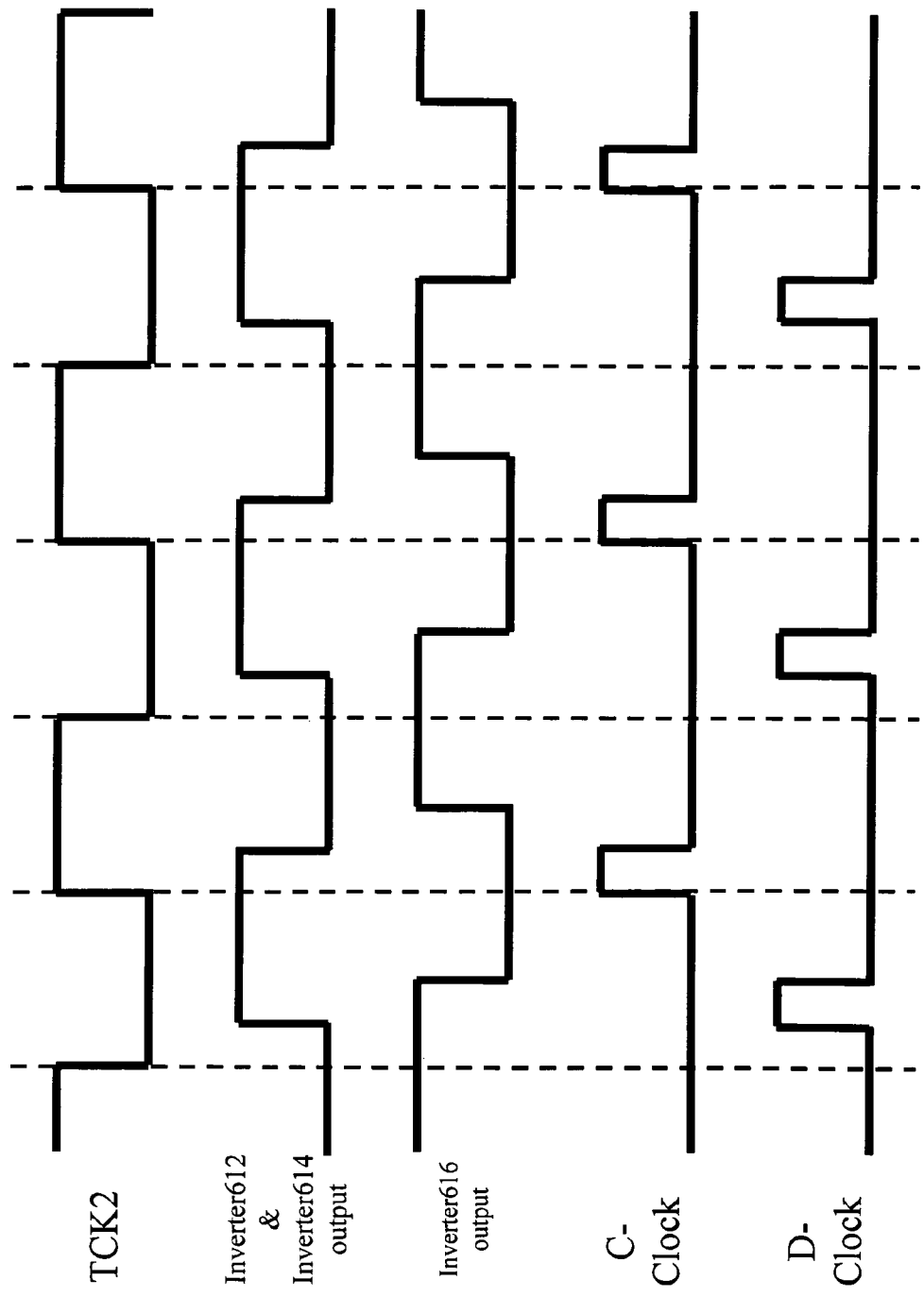
FIG. 24 is a waveform diagram showing the operation of the circuit for generating a clock signal.

Further, in a circuit shown in FIG. 21, clocks A-Clock and B-Clock are generated from an up edge and down edge of a test clock. The top waveform in FIG. 22 indicates an output of a test clock TCK1. The second waveform from the top in FIG. 22 indicates an output of inverters 602 and 604. The third waveform from the top in FIG. 22 indicates an output of an inverter 606. The fourth waveform from the top in FIG. 22 is a waveform of the clock A-Clock, which is output from an AND circuit 608. The fifth waveform from the top in FIG. 22 is a waveform of the clock B-Clock, which is output from an AND circuit 610. For a multi-phase clock signal, however, the number of test clocks needs to be increased. For example, as shown in FIG. 23, to generate a four-phase clock, a second test clock TCK2 is used in addition to the test clock TCK1, and clock pulses are generated using an up edge and down edge of each of the test clocks TCK1 and TCK2. The top waveform in FIG. 24 indicates an output of the second test clock TCK2. The second waveform from the top in FIG. 24 indicates an output of the inverters 612 and 614. The third waveform from the top in FIG. 24 indicates an output of an inverter 616. The fourth waveform from the top in FIG. 24 is a waveform of a clock C-Clock, which is output from an AND circuit 618. The fifth waveform from the top in FIG. 24 is a waveform of a clock D-Clock, which is output from an AND circuit 620.

In this embodiment, on the other hand, a state machine which makes transition to states by a test clock is formed, and a clock signal is output according to each of the states. This can prevent an increase in the number of LSI terminals.

The foregoing description has been given for better understanding of the embodiment, and other embodiments are conceivable. A variety of modifications may be made without departing from the scope of the technique. For example, in the flip-flop circuit shown in FIG. 1 and a control method therefor, a single slave latch is provided for three master latches. However, any number of master latches may be used. Based on the number of master latches, a clock generation circuit may be formed. Furthermore, for example, scan-in data may be output from a slave latch of a circuit having a plurality of flip-flop circuits shown in FIG. 16, which are connected to each other, and may be input to the LSI test circuit shown in FIG. 1 to form a scan chain. Moreover, for example, scan-in data may be output from a slave latch of the LSI test circuit shown in FIG. 1, and may be input to the flip-flop circuit shown in FIG. 16 to form a scan chain. Moreover, for example, the flip-flop circuit shown in FIG. 16 may be connected between continuous master latches in the LSI test circuit shown in FIG. 1 to form a scan chain.

What is claimed is:

1. A logic circuit comprising:
a plurality of master-slave flip-flop circuits comprising:
a first master latch included in one of said master-slave flip-flop circuits, the first master latch having a first scan data input for receiving scan data, the first master latch latching the scan data and outputting latched scan data;
a second master latch included in one of said master-slave flip-flop circuits, the second master latch having a second scan data input operatively connected to receive an output of the first master latch, the second master latch latching the scan data inputted into the second scan data input and outputting latched scan data;
a third master latch included in one of said master-slave flip-flop circuits, the third master latch having a third scan data input operatively connected to receive an output of the second master latch, the third master latch latching the scan data inputted into the third scan data input and outputting latched scan data; and
a slave latch included in one of said master-slave flip-flop circuits, the slave latch having a scan data input operatively connected to receive an output of the third master latch, the slave latch latching the scan data inputted into the scan data input and outputting latched scan data:
wherein a first clock signal is inputted into the first master latch, a second clock signal is inputted into the second master latch, a third clock signal is inputted into the third master latch and a fourth clock signal is inputted into the slave latch.

2. The logic circuit of claim 1, wherein the first master latch further comprises a first output for outputting data, the second master latch further comprises a second output for outputting data and the third master latch further comprises a third output for outputting data.

3. The logic circuit of claim 1, wherein the third master latch further comprises a clock input for receiving a clock signal, the third master latch outputting latched scan data to the slave latch when the clock input receiving the clock signal.

4. The logic circuit of claim 1, wherein the first master latch latches the scan data inputted into the first scan data input when the first clock signal is inputted into the first master latch;
the second master latch latches the scan data inputted into the second scan data input when the second clock signal is inputted into the second master latch;
the third master latch latches the scan data inputted into the third scan data input when the third clock signal is inputted into the third master latch; and
the slave latch latches the scan data inputted into the third master latch when the fourth clock signal is inputted into the slave latch.

5. The logic circuit of claim 4, wherein the first clock signal, the second clock signal, the third clock signal and the fourth clock signal are generated by a clock generating circuit receiving a test clock signal.

6. The logic circuit of claim 5, wherein the clock generating circuit comprises:
a first divider circuit for dividing the test clock signal by two;
a second divider circuit for dividing the test clock signal by four;
a third divider circuit for dividing the test clock signal by eight;
a first logic circuit for performing AND operation between an output of the first divider circuit, an inversion output of the second divider circuit and an inversion output of the third divider circuit and outputting a result of the AND operation as a first clock;
a second logic circuit for performing AND operation between the output of the first divider circuit, an output of the second divider circuit and the inversion output of the third divider circuit and outputting a result of the AND operation as a second clock;

a third logic circuit for performing AND operation between the output of the first divider circuit, the inversion output of the second divider circuit and an output of the third divider circuit and outputting a result of the AND operation as a third clock; and a fourth logic circuit for performing AND operation between the output of the first divider circuit, the output of the second divider circuit and the output of the third divider circuit and outputting a result of the AND operation as a fourth clock.

7. The logic circuit of claim 5, wherein the clock generating circuit comprises:

a frequency multiplier circuit for generating multiplying clock by multiplying the test clock signal by two;

a first divider circuit for dividing the multiplying clock by two;

a second divider circuit for dividing the multiplying clock by four;

a first chopper circuit for performing an AND operation between an output of the first divider circuit and an inversion output of the second divider circuit and outputting the first clock on the basis of detecting a rising edge of a result of the AND operation;

a second chopper circuit for performing an AND operation between an inversion output of the first divider circuit and an output of the second divider circuit and outputting the second clock on the basis of detecting a rising edge of a result of the AND operation;

a third chopper circuit for performing an AND operation between the output of the first divider circuit and the output of the second divider circuit and outputting the third clock on the basis of detecting a rising edge of a result of the AND operation; and a fourth chopper circuit for performing an AND operation between the inversion output of the first divider circuit and the output of the second divider circuit and outputting the fourth clock on the basis of detecting a rising edge of a result of the AND operation.

8. A flip-flop circuit comprising:

a first master latch having a first scan data input for receiving scan data, the first master latch latching the scan data and outputting latched scan data;

a second master latch having a second scan data input operatively connected to receive an output of the first master latch, the second master latch latching the scan data inputted into the second scan data input and outputting latched scan data;

a third master latch having a third scan data input operatively connected to receive an output of the second master latch, the third master latch latching the scan data inputted into the third scan data input and outputting latched scan data; and a slave latch having a scan data input operatively connected to receive an output of the third master latch, the slave latch latching the scan data inputted into the scan data input and outputting latched scan data, wherein a first clock signal is inputted into the first master latch, a second clock signal is inputted into the second master latch, a third clock signal is inputted into the third master latch and a fourth clock signal is inputted into the slave latch.

* * * * *

UNITED STATES PATENT AND TRADEMARK OFFICE
CERTIFICATE OF CORRECTION

PATENT NO.         : 7,847,582 B2
APPLICATION NO.    : 12/155829
DATED              : December 7, 2010
INVENTOR(S)        : Yoshihiko Satsukawa It is certified that error appears in the above-identified patent and that said Letters Patent is hereby corrected as shown below:

In the Claims:
Column 16, Line 19 in Claim 1, delete "data:" and insert -- data, --, therefor.

Signed and Sealed this
First Day of March, 2011

David J. Kappos
*Director of the United States Patent and Trademark Office*